US012787243B2

(12) United States Patent
Zhao et al.

(10) Patent No.: US 12,787,243 B2
(45) Date of Patent: Nov. 3, 2026

(54) SEMICONDUCTOR FIN WITH DIVOTS, TRANSISTOR INCLUDING THE SEMICONDUCTOR FIN, MEMORY CELL INCLUDING THE TRANSISTOR, AND ASSOCIATED METHODS

(71) Applicant: GlobalFoundries U.S. Inc., Malta, NY (US)

(72) Inventors: Meixiong Zhao, Ballston Lake, NY (US); Hongliang Shen, Ballston Lake, NY (US); Randy William Mann, Milton, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 587 days.

(21) Appl. No.: 18/448,467

(22) Filed: Aug. 11, 2023

(65) Prior Publication Data

US 2025/0056783 A1 Feb. 13, 2025

(51) Int. Cl.
*H10D 30/01* (2025.01)
*H10B 10/00* (2023.01)
(Continued)

(52) U.S. Cl.
CPC ........... *H10B 10/12* (2023.02); *H10D 30/024* (2025.01); *H10D 30/6211* (2025.01);
(Continued)

(58) Field of Classification Search
CPC ......... H10D 30/024–0245; H10D 30/62–6219
See application file for complete search history.

(56) References Cited

U.S. PATENT DOCUMENTS 8,759,943 B2 6/2014 Tseng et al.
9,455,314 B1 * 9/2016 Cheng .................. H10D 30/024
(Continued)

OTHER PUBLICATIONS

Lee et al., "Radiation-Induced Soft Error Rate Analyses for 14nm FinFET SRAM Devices," retrieved from: https:// ieeexplore.IEEE.org/abstract/document/7112728 on Apr. 10, 2023, p. 4B.1.1-4B.1.4.
(Continued)

*Primary Examiner* — William B Partridge
*Assistant Examiner* — Gustavo G Ramallo
(74) *Attorney, Agent, or Firm* — Yee Tze Lim; Hoffman Warnick LLC

(57) ABSTRACT

Disclosed semiconductor structures include semiconductor fin(s), each extending from a semiconductor substrate and having opposing sidewalls. Each fin has a lower portion and an upper portion above the lower portion. The lower portion has a base proximal to the semiconductor substrate and divots within the opposing sidewalls at the base. An isolation region is on the semiconductor substrate adjacent to the opposing sidewalls of each fin (e.g., including within the divots). The upper portion of each fin extends above the level of the top surface of the isolation region and can be incorporated into a single-fin or multi-fin fin-type device (e.g., a fin-type field effect transistor (FINFET)). In some embodiments, multiple single-fin and/or multi-fin FINFETs incorporating the upper portions of such fins can be incorporated into a memory cell, such as a static random access memory (SRAM) cell. Also disclosed herein are associated method embodiments.

19 Claims, 24 Drawing Sheets

(51) Int. Cl.

| | |
|---|---|
| ***H10D 30/62*** | (2025.01) |
| ***H10D 64/01*** | (2025.01) |
| ***H10D 84/01*** | (2026.01) |
| ***H10D 84/03*** | (2025.01) |
| ***H10D 84/85*** | (2025.01) |

(52) U.S. Cl.
CPC ....... *H10D 64/021* (2025.01); *H10D 84/0184* (2025.01); *H10D 84/0188* (2025.01); *H10D 84/0193* (2025.01); *H10D 84/038* (2025.01); *H10D 84/853* (2025.01)

(56) References Cited

U.S. PATENT DOCUMENTS

| | | | | |
|---|---|---|---|---|
| 9,786,765 | B2 | 10/2017 | Nowak et al. | |
| 2012/0086053 | A1 | 4/2012 | Tseng et al. | |
| 2016/0133624 | A1* | 5/2016 | Liao | H10B 12/053<br>257/334 |
| 2018/0108732 | A1 | 4/2018 | Shu et al. | |
| 2021/0005601 | A1* | 1/2021 | Shu | H10D 62/115 |
| 2021/0151557 | A1* | 5/2021 | Li | H10D 30/6219 |
| 2021/0305375 | A1* | 9/2021 | Kim | H10D 30/024 |

OTHER PUBLICATIONS

Liu et al., "Soft-Error Performance Evaluation on Emerging Low Power Devices," IEEE Transactions on Device and Materials Reliability, vol. 14, No. 2, Jun. 2014, pp. 732-741.

* cited by examiner

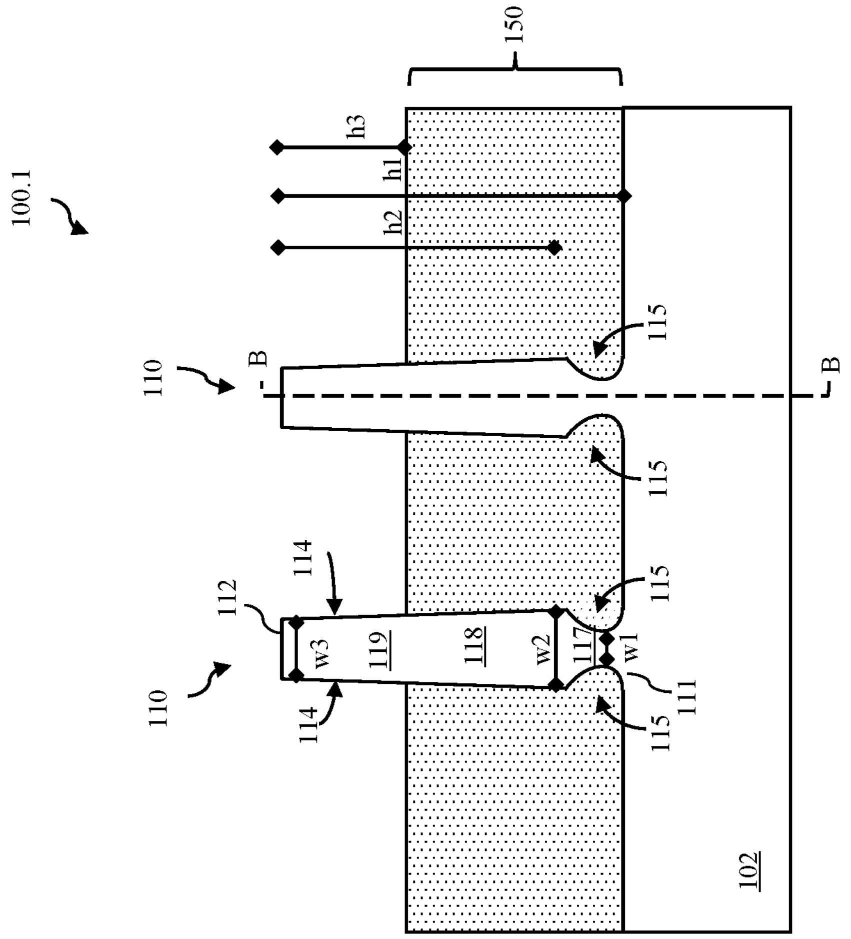
FIG. 1.1A

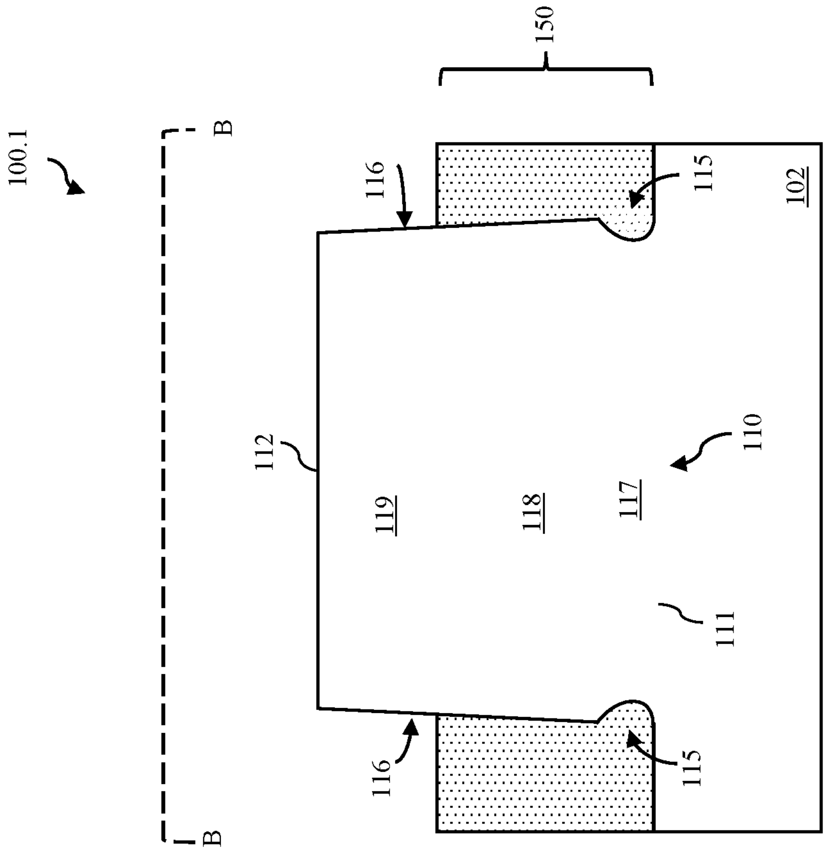
FIG. 1.1B

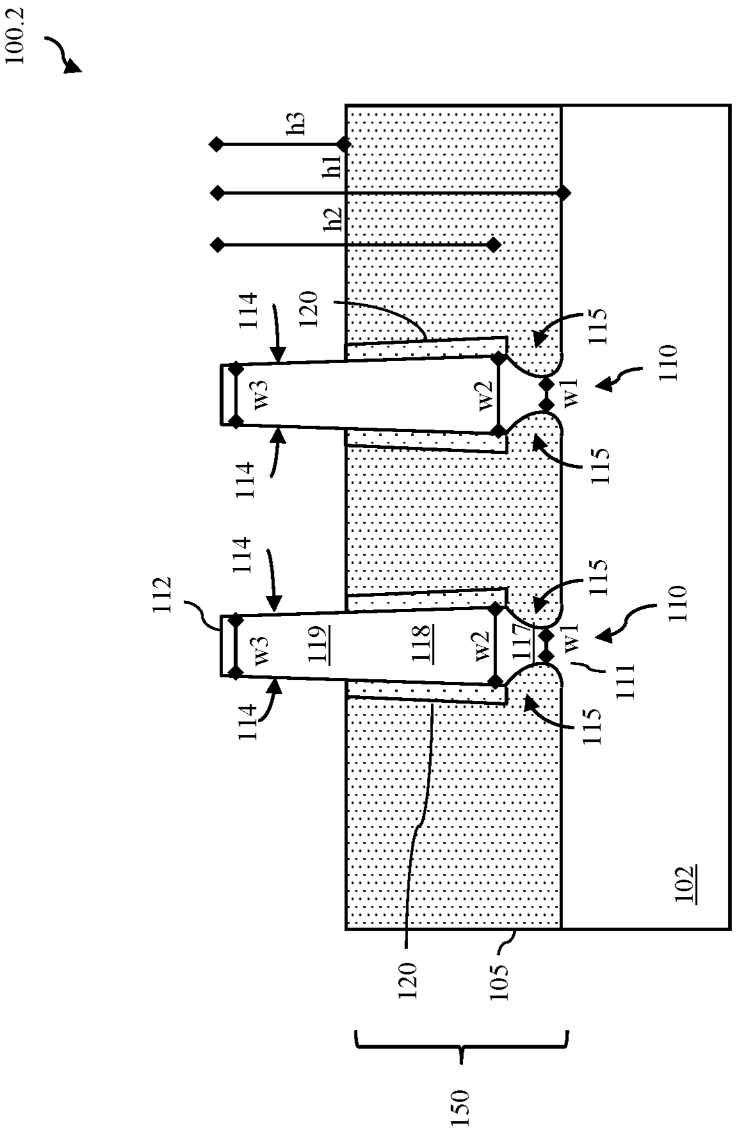
FIG. 1.2

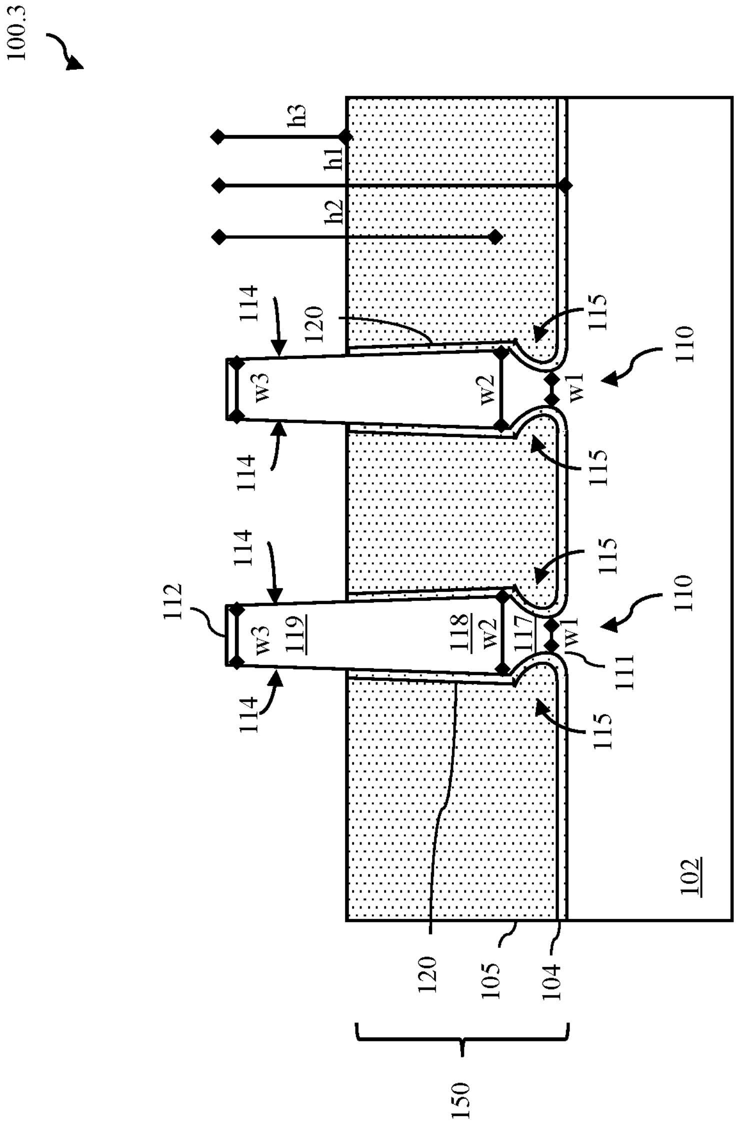
FIG. 1.3

SEMICONDUCTOR FIN WITH DIVOTS, TRANSISTOR INCLUDING THE SEMICONDUCTOR FIN, MEMORY CELL INCLUDING THE TRANSISTOR, AND ASSOCIATED METHODS

BACKGROUND

The present disclosure relates to fin-type semiconductor devices (e.g., fin-type field effect transistors (FINFETs)) with improved device-to-substrate geometric isolation for reduced susceptibility to radiation-induced single event upsets (SEUs) (e.g., in space and medical applications), to circuits incorporating the fin-type semiconductor devices (e.g., memory cells incorporating FINFETs), and to associated methods.

Factors considered in modern integrated circuit (IC) design include, but are not limited to, performance improvement, size scaling, and power consumption. Oftentimes, however, there is a tradeoff between these factors. For example, size scaling of planar field effect transistors (FETs) resulted in devices that suffered from short channel effects and accommodated less drive current. In response, FINFETs were developed. A FINFET is a non-planar FET that includes a relatively thin semiconductor fin (e.g., a thin, elongated, essentially rectangular shaped semiconductor body) that extends upward from a semiconductor substrate. An isolation region laterally surrounds a lower portion of the semiconductor fin. An active device region for the FINFET is within an upper portion of the semiconductor fin and includes a channel region positioned laterally between source/drain regions. A gate stack is above the isolation region adjacent to the top surface and opposing sidewalls of the upper portion of the semiconductor fin at the channel region. The gate stack is isolated from the source/drain regions by gate sidewall spacers. Two-dimensional field effects (as opposed to one-dimensional field effects in planar FETs) are exhibited at the opposing sidewalls of the upper portion of the semiconductor fin at the channel region for increased drive current. Drive current can be increased further by incorporating multiple parallel semiconductor fins into the FINFET. Single-fin or multi-fin FINFETs may replace planar FETs in various different types of devices for improved performance. For example, single-fin or multi-fin FINFETs may replace planar FETs in memory cells, such as in static random access memory (SRAM) cells, for improved performance. However, memory cells that include single-fin or multi-fin FINFETs are more susceptible to radiation induced SEUs and, thus, tend to have a relatively high soft error rate (SER).

SUMMARY

Disclosed herein are embodiments of a structure that includes a semiconductor fin, which extends from a semiconductor substrate. The semiconductor fin can have opposing sidewalls, a lower portion proximal to the semiconductor substrate, and an upper portion above the lower portion. The lower portion of the semiconductor fin can further have divots within the opposing sidewalls. The structure can also include an isolation region on the semiconductor substrate and positioned laterally adjacent to the opposing sidewalls. In this structure, the isolation region is adjacent to the lower portion of the semiconductor fin and the upper portion of the semiconductor fin extends above the isolation region (e.g., so the top of the semiconductor fin is above the level of the top surface of the isolation region).

Disclosed herein are also embodiments of structure, which includes a device (e.g., a FINFET) that incorporates at least one semiconductor fin with a lower portion having divots in the opposing sidewalls and embodiments of a structure, which includes a circuit (e.g., a memory cell) that incorporates at least one such device. For example, a disclosed structure can include a semiconductor substrate and multiple semiconductor fins extending from the semiconductor substrate. The semiconductor fins can each have opposing sidewalls, a lower portion proximal to the semiconductor substrate, and an upper portion above the lower portion. The lower portions of the semiconductor fins can have divots within the opposing sidewalls. The structure can further include an isolation region on the semiconductor substrate and positioned laterally adjacent to the opposing sidewalls. In this structure, the lower portions of the semiconductor fins are adjacent to the isolation region and the upper portions of the semiconductor fins extend above the isolation region (e.g., so the tops of the semiconductor fins are above the level of the top surface of the isolation region). The structure can also include a memory cell with multiple fin-type field effect transistors (FINFETs). Each FINFET in the memory cell can include an upper portion of at least one of the semiconductor fins.

Also disclosed herein are method embodiments for forming the disclosed structures. For example, a disclosed method can include forming semiconductor fins, which extend from the semiconductor substrate, which have opposing sidewalls, which have lower portions proximal to the semiconductor substrate and including divots within the opposing sidewalls, and which have upper portions above the lower portions. The method can further include forming an isolation region on the semiconductor substrate positioned laterally adjacent to the opposing sidewalls of the semiconductor fins. The isolation region can specifically be formed so that the lower portions of the semiconductor fins are adjacent to the isolation region and so that the upper portions of the semiconductor fins extend above the isolation region (e.g., so the tops of the semiconductor fins are above the level of the top surface of the isolation region).

It should be noted that all aspects, examples, and features of disclosed embodiments mentioned above can be combined in any technically possible way. That is, two or more aspects of any of the disclosed embodiments, including those described in this summary section, may be combined to form implementations not specifically described herein. The details of one or more implementations are set forth in the accompanying drawings and the description below. Other features, objects and advantages will be apparent from the description and drawings, and from the claims.

BRIEF DESCRIPTION OF THE DRAWINGS

The present disclosure will be better understood from the following detailed description with reference to the drawings, which are not necessarily drawn to scale and in which:

FIGS. 1.1A and 1.1B are different cross-section drawings illustrating a disclosed embodiment of a semiconductor structure with a semiconductor fin having sidewall divots;

FIG. 1.2 is a cross-section drawing illustrating another disclosed embodiment of a semiconductor structure with a semiconductor fin having sidewall divots;

FIG. 1.3 is a cross-section drawing illustrating another disclosed embodiment of a semiconductor structure of a semiconductor fin having sidewall divots;

DETAILED DESCRIPTION

Figure 2A:
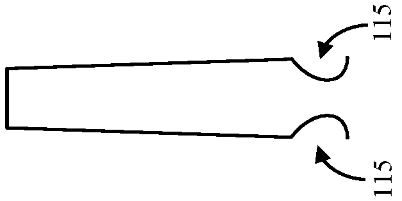
FIGS. 2A-2E are cross-section diagrams of various alternative shapes for the sidewall divots in the disclosed semiconductor structure embodiments.

As mentioned above, single-fin or multi-fin FINFETs may replace planar FETs in various different types of devices for improved performance. For example, single-fin or multi-fin FINFETs may replace planar FETs in memory cells, such as in static random access memory (SRAM) cells, for improved performance. However, memory cells that include single-fin or multi-fin FINFETs are more susceptible to radiation-induced SEUs and, thus, tend to have a higher SER compared to planar FETs formed as semiconductor-on-insulator devices (e.g., silicon-on-insulator (SOI) devices). Those skilled in the art will recognize that a "soft error" refers to an error caused by random radiation events that occur naturally. SER is the rate at which a device or system is predicted to encounter soft errors and is typically measured in either failures in time (FIT) or mean time between failures (MTBF). SER has been found to be a function of device-to-substrate geometric isolation (e.g., SER decreases with increased device-to-substrate geometric isolation). For example, since planar FETs formed as semiconductor-on-insulator devices (e.g., as silicon-on-insulator (SOI) devices) are geometrically isolated from a semiconductor substrate below by an insulator layer, memory cells that incorporate such planar FETs may have a relatively low SER. However, since semiconductor fins incorporated into FINFETs typically have lower portions that extend through an isolation region to a semiconductor substrate below, memory cells that incorporate such FINFETs are not geometrically isolated from the semiconductor substrate and, thus, are more susceptible to radiation induced SEUs and have relatively high SERs.

In view of the foregoing, disclosed herein are embodiments of a semiconductor structure that includes one or more semiconductor fins with improved geometric isolation from the semiconductor substrate below. Specifically, in the disclosed semiconductor structure embodiments, each semiconductor fin can extend upward from a semiconductor substrate, can have opposing sidewalls, and can further have a lower portion with a base proximal to the substrate and an upper portion above the lower portion. The lower portion of each fin can have divots within the opposing sidewalls at the base. An isolation region can be on the semiconductor substrate positioned laterally adjacent to the opposing sidewalls of each fin (e.g., including within the divots). The upper portion of such a semiconductor fin can extend above the level of the top surface of the isolation region and can, for example, be incorporated into any one of various different types of single-fin or multi-fin fin-type devices (e.g., a FINFET, a fin-type bipolar junction transistor (BJT), a fin-type passive device, etc.). In some embodiments, multiple single-fin and/or multi-fin FINFETs incorporating the upper portions of such semiconductor fins can be incorporated into a memory cell, such as a static random access memory (SRAM) cell. Due to the divots, the semiconductor fin(s) in the disclosed semiconductor structures are narrowest at the base to improve geometric isolation of the semiconductor substrate from any devices above the isolation region. Thus, in the disclosed semiconductor structures, fin-type device(s) (e.g., FINFET(s) and, if applicable, memory cell(s) incorporating FINFETs) are less susceptible to radiation induced SEUs and have reduced SERs. Also disclosed herein are associated method embodiments.

Referring to FIGS. 1.1A-1.1B, 1.2, and 1.3, disclosed herein are embodiments of a semiconductor structure 100.1, 100.2, and 100.3, respectively, including one or more semiconductor fins 110 having improved geometric isolation from a semiconductor substrate 102 below. Specifically, the semiconductor structure 100.1, 100.2, 100.3 can include a semiconductor substrate 102. The semiconductor substrate 102 can be, for example, a monocrystalline silicon substrate or a monocrystalline substrate of any other suitable semiconductor material (e.g., silicon germanium, silicon carbide, etc.). The semiconductor structure 100.1, 100.2, 100.3 can further include one or more semiconductor fins 110, which extend away from (e.g., upward from) a surface of the semiconductor substrate 102. As discussed in greater detail below regarding the method embodiments, the semiconductor fin(s) 110 can be formed from a portion of the semiconductor substrate such that they are made of the same monocrystalline semiconductor material as the semiconductor substrate 102.

Those skilled in the art will recognize that a semiconductor fin generally refers to an elongated relatively tall and thin (i.e., high aspect ratio) semiconductor body. Semiconductor fins are often formed with the goal of making them essentially rectangular in shape with a base proximal to the semiconductor substrate, with a top distal to the semiconductor substrate, and with opposing sidewalls and opposing end walls that extend vertically from the semiconductor substrate (e.g., such that they are essentially perpendicular to the bottom surface of the semiconductor substrate). However, etch techniques used to form semiconductor fins may result opposing sidewalls and opposing end walls that are, for example, at 90 degrees+/−10-20% to the bottom surface of the semiconductor substrate and/or slightly curved (e.g., concave, or convex). As a result, a semiconductor fin may have a tapering width (i.e., a decreasing width) from a maximum width at the base to a minimum width at the top. With such a fin-shape (e.g., rectangular or with a tapering width), the upper portion of the semiconductor fin used to form devices is not particularly isolated from the semiconductor substrate. As discussed in greater detail below, in the disclosed embodiments, the semiconductor structure 100.1, 100.2, 100.3 includes divots 115 at the base of each semiconductor fin 110 to improve geometric isolation from the semiconductor substrate.

More particularly, in the semiconductor structure 100.1, 100.2, the semiconductor fin(s) 110 have a lower portion 117 with a base 111 proximal to the semiconductor substrate, an upper portion 119 with a top 112 distal to the semiconductor substrate 102, a middle portion 118 vertically between the lower portion 117 and the upper portion 119. Each semiconductor fin 110 can further have opposing sidewalls 114 and opposing end walls 116 (e.g., see FIG. 1.1B) that extend from the base 111 to the top 112. The opposing sidewalls 114 and opposing end walls 116 could be oriented essentially perpendicular to the bottom surface of the semiconductor substrate or, due to the etch technique used during fin formation, could be at 90 degrees+/−10-20% to the bottom surface of the semiconductor substrate and/or slightly curved (e.g., concave, or convex).

Figure 2B:
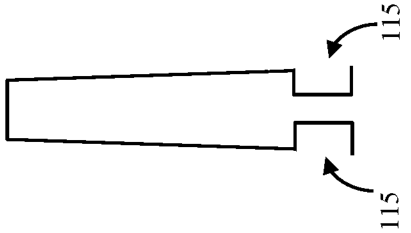
Figure 2C:
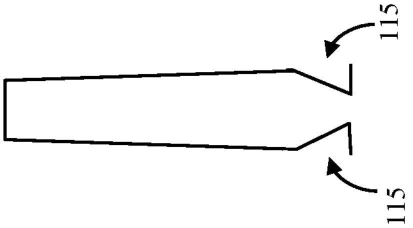
Figure 2D:
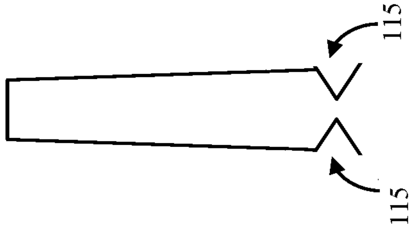
Figure 2E:
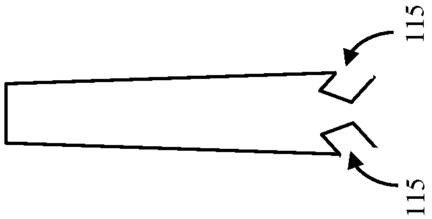

Additionally, the semiconductor fin(s) 110 can also have divots 115 within the opposing sidewalls 114 and, optionally, within the opposing end walls 116 (e.g., as illustrated in FIG. 1.1B) in the lower portion 117 and, particularly, at the base 111 proximal to the semiconductor substrate 102. For purposes of this disclosure, a "divot" refers to a notch in the sidewall. A divot 115 can have a concave, C-shape, or curved-shape, as illustrated in FIGS. 1.1A-1.1B, 1.2, and 1.3 and further illustrated in FIG. 2A. Alternatively, a divot 115 could have some other shape (e.g., due to the etched technique used during formation. For example, a divot 115 could have any of the following: a rectangular shape with horizontal top and bottom surfaces and a vertical end wall (e.g., see FIG. 2B), a triangular shape with one surface parallel to the bottom of the substrate and a converging angular surface (e.g., see FIG. 2C), a triangular shape with two converging angular surfaces (e.g., see FIG. 2D), a diamond shape (e.g., see FIG. 2E), or any other suitable divot shape. As illustrated, the divots 115 on the opposing sidewalls can be essentially symmetrical.

Given the divots 115, the lower portion 117 and, particularly, the base 111 of each semiconductor fin 110 is narrower (e.g., see first width (w1)) than the middle portion 118 (e.g., see second width (w2)>w1) and, optionally, that is narrower than both the middle portion 118 and the upper portion 119 (e.g., see third width (w3) at top 112, where w3>w1). For example, w1 can range between 10-60% of w2 (e.g., w1 can be approximately 20% of w2). Optionally, each semiconductor fin 110 can further have a tapering width from a point above the divots 115 (e.g., w3<w2).

The semiconductor structure 100.1, 100.2, 100.3 can further include an isolation region 150. The isolation region 150 can be on semiconductor substrate 102, can laterally surround the lower and middle portions 117-118 of each semiconductor fin 110 and can further extend laterally between adjacent semiconductor fins 110. The upper portion 119 of each semiconductor fin 110 can extend vertically above the level of the top surface of the isolation region 150. As discussed in greater detail below, the isolation region 150 can include one or more isolation materials (e.g., at least one isolation layer). Isolation material(s) of the isolation region 150 can be positioned laterally immediately adjacent to the lower and middle portions of the semiconductor fins. Furthermore, isolation material(s) of the isolation region 150 can completely fill the divots 115, as illustrated. Alternatively, due to the techniques used to deposit the isolation material(s) and/or due to the dimensions of the divots 115 themselves, a gap (also referred to herein as a cavity, void, etc.) may be within any divot and encapsulated by isolation material. Such a gap may be filled with air (i.e., an airgap), filled with gas, or under vacuum. In any case, the top surface of the isolation region 150 can be some distance above the level of the tops of the divots 115 and below the level of the top 112 of each semiconductor fin 110 such that the upper portion 119 of each semiconductor fin 110 extends some predetermined height (e.g., see height (h3)) above the isolation region 150.

In the disclosed embodiments, the isolation material(s) of the isolation region 150 can include, but are not limited to, any one or more of the following: silicon dioxide, silicon oxynitride, undoped silicate glass (USG), and/or any other suitable isolation material (e.g., borophosphosilicate glass (BPSG), phosphosilicate glass (PSG), etc.). Optionally, the isolation region 150 can include one or more additional features, as described in greater detail below, due to the semiconductor structure formation techniques used.

For example, referring to FIGS. 1.2 and 1.3, in the semiconductor structure 100.2, 100.3, the isolation region 150 can include at least one isolation layer 105 (e.g., a silicon dioxide isolation layer or one or more other types of isolation layer(s)). The isolation region 150 can also include dielectric sidewall spacers 120, which are positioned laterally immediately adjacent to the opposing sidewalls 114 (and optionally the end walls, not shown) of each semiconductor fin 110 only on the middle portion 118 between the tops of the divots 115 and the upper portion 119. Thus, in this case, the top surface of the isolation region 150 can include the tops of the dielectric sidewall spacers 120 and the top surface of the one or more isolation layers 105. The tops of the dielectric sidewall spacers 120 and the top surface of the one or more of isolation layers 105 can be essentially co-planar. Alternatively, there may be some variation in height between the tops of the dielectric sidewall spacers 120 and the top surface of the one or more isolation layers 105. The dielectric sidewalls spacers 120 can be made of a dielectric sidewall spacer material (e.g., silicon dioxide or any other suitable dielectric sidewall spacer material) and can physically separate the middle portion 118 of each semiconductor fin 110 from the isolation region 150.

Referring for example to FIG. 1.3, in the semiconductor structure 100.3, the isolation region 150 can also include a dielectric liner 104 immediately adjacent to the opposing sidewalls 114 of the lower portion of each semiconductor fin 110 including within the divots 115 and further immediately adjacent to surfaces of the semiconductor substrate 102 on either side of the lower portion 117 (e.g., extending between adjacent semiconductor fin(s) 110). The dielectric liner 104, dielectric sidewall spacers 120, and isolation layer 105 can all be made of the same dielectric material (e.g., an oxide, such as silicon dioxide). Alternatively, one of these features (i.e., dielectric liner 104, dielectric sidewall spacers 120, and isolation layer 105) could be made of a different isolation material. For example, the dielectric liner 104 and dielectric sidewall spacers 120 could be made of silicon dioxide, whereas the isolation layer 105 could be made of some other isolation material. Alternatively, all three of these features (i.e., dielectric liner 104, dielectric sidewall spacers 120, and isolation layer 105) could be made of different isolation materials.

The semiconductor structure 100.1, 100.2, 100.3 (as described above and illustrated in FIGS. 1.1A-1.1B, 1.2, 1.3) can be incorporated into various other semiconductor structures designed to include at least one fin-type device above the isolation region 150. The fin-type devices can, for example, include the upper portion 119 of a single semiconductor fin 110 with divots 115 (e.g., for a single-fin fin-type device) or the upper portions 119 of multiple semiconductor fins 110 with divots 115 (e.g., for a multi-fin fin-type device). Various different single-fin and multi-fin fin-type devices are known in the art. Such devices include, but are not limited to, fin-type field effect transistors (FIN- FETs), fin-type bipolar junction transistors (fin-type BJTs), and fin-type passive devices (e.g., resistors, etc.) and can incorporate the upper portion(s) 119 of semiconductor fin(s) 110 with divots 115, as described above. Furthermore, it should be understood that any other subsequently developed fin-type device could incorporate the upper portion(s) 119 of semiconductor fin(s) 110 with divots 115.

Figure 3A:
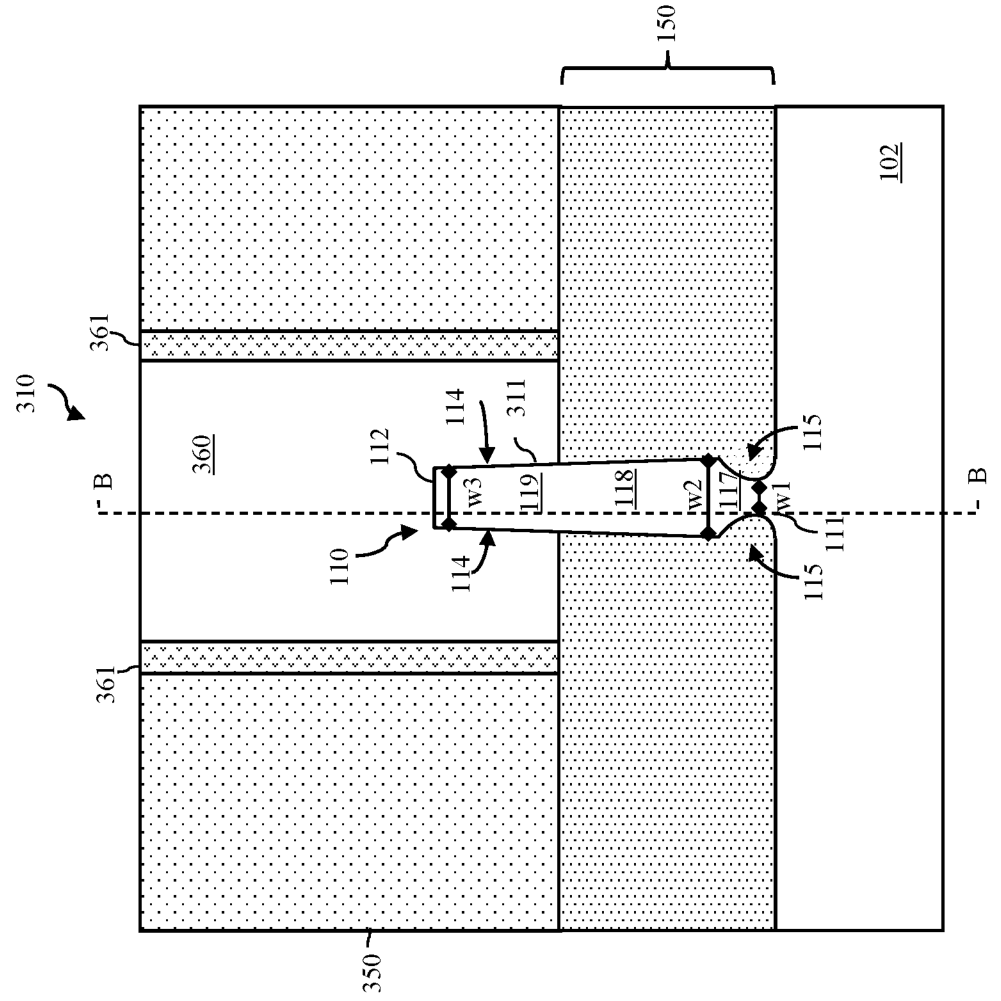
FIGS. 3A-3C are different cross-section diagrams illustrating a disclosed embodiment of a semiconductor structure that includes a device (e.g., a FINFET) with a semiconductor fin having sidewall divots.
Figure 3B:
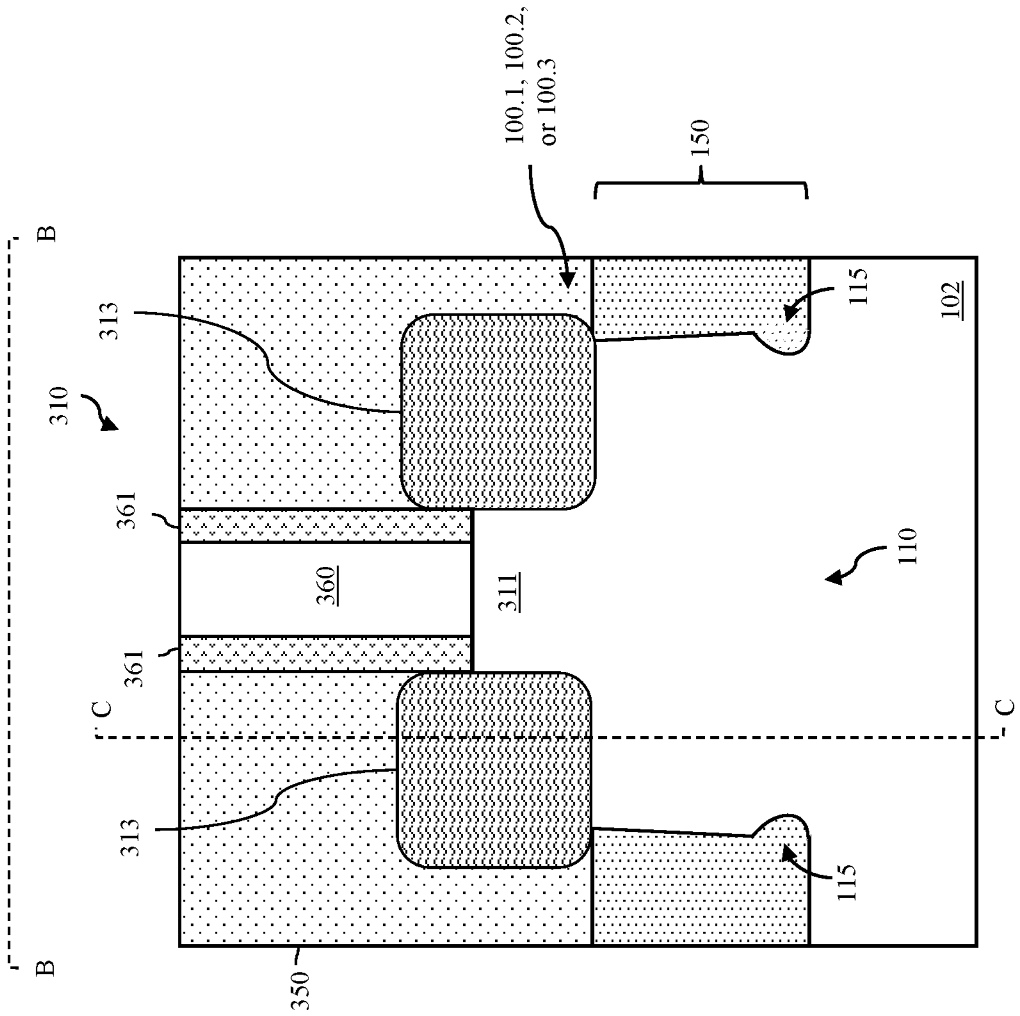
Figure 3C:
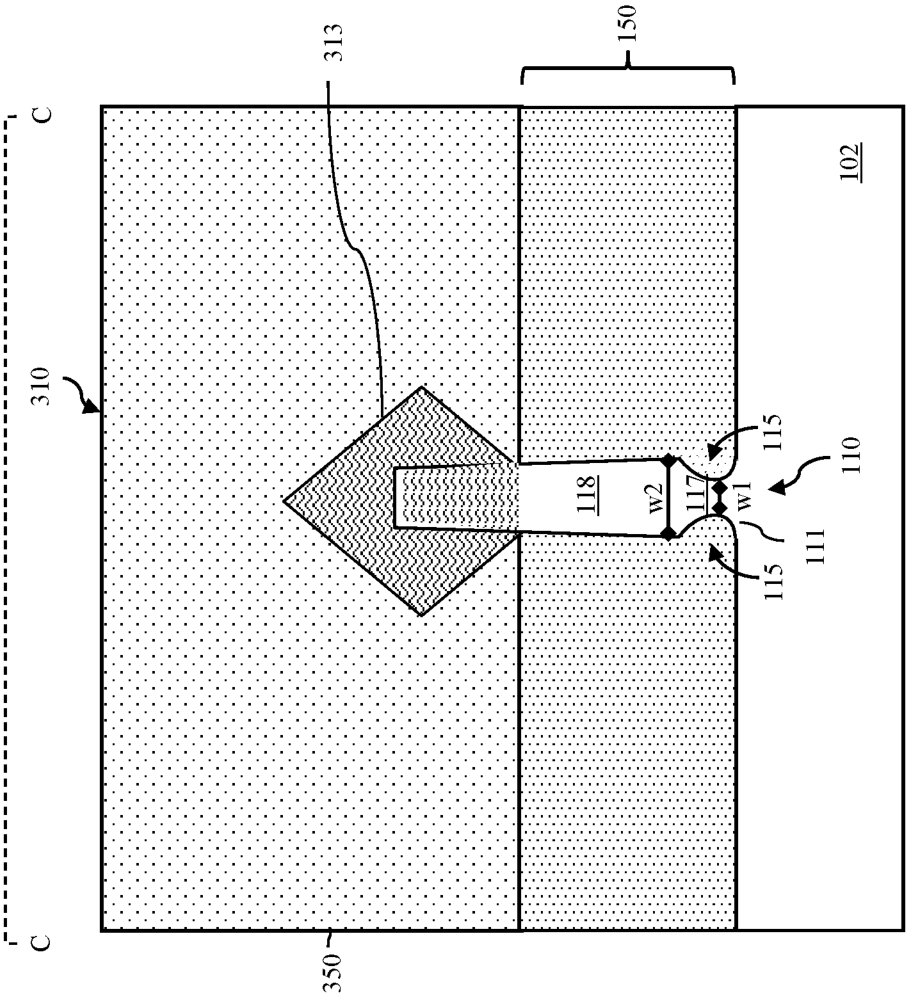

For the purposes of illustration, FIGS. 3A-3C show different cross-section diagrams of a semiconductor structure that includes a semiconductor fin 110 with divots 115, as shown in the semiconductor structure 100.1 of FIGS. 1.1A-1.1A, and that further includes a single-fin FINFET 310, which is above the isolation region 150 and which includes an active device region in an upper portion 119 of the semiconductor fin 110. FINFET 310 can be an N-type FET (NFET) or a P-type FET (PFET). Within the FINFET 310, the upper portion 119 of the semiconductor fin 110 can include a channel region 311 positioned laterally between source/drain regions 313. Various different source/drain configurations are known in the art and could be incorporated into FINFET 310. For example, the source/drain regions 313 can include, for example, sections of the upper portion of the semiconductor fin on either side of the channel region 311 and in situ doped epitaxial semiconductor material grown on the top surface and opposing sides of those sections. Alternatively, the source/drain regions 313 can have any other suitable source/drain region configuration known in the art. In any case, those skilled in the art will recognize that, typically, the channel region of an NFET can be undoped (i.e., intrinsic) or, alternatively, doped so as to have P-type conductivity at a relatively low conductivity level (i.e., P− conductivity) and the source/drain regions can be doped so as to have N-type conductivity at a relatively high conductivity level (i.e., N+ conductivity or higher). The channel region of a PFET can be undoped (i.e., intrinsic) or, alternatively, doped so as to have N-type conductivity at a relatively low conductivity level (i.e., N− conductivity) and the source/drain regions can be doped so as to have P-type conductivity at a relatively high conductivity level (i.e., P+ conductivity or higher).

One or more middle of the line (MOL) dielectric layers 350 can cover the source/drain regions 313 and top surface of the portions of the isolation region 150 adjacent thereto. MOL dielectric layer(s) 350 can include, for example, an optional etch stop layer and a blanket interlayer dielectric (ILD) material layer on the etch stop layer. The optional etch stop layer can be, for example, a relatively thin conformal silicon nitride layer or a relatively thin conformal layer of some other suitable etch stop material. The blanket ILD material layer can be, for example, a blanket layer of silicon dioxide layer, a layer of USG, PSG or BPSG, or a blanket layer of any other suitable ILD material.

FINFET 310 can further include gate 360 above the isolation region 150 and adjacent to the top 112 and opposing sidewalls 114 of the upper portion 119 of the semiconductor fin 110 at the channel region 311. Gate 360 can include a gate dielectric layer, including one or more layers of gate dielectric material, adjacent to the top and opposing sidewalls and a gate conductor layer, including one or more layers of gate conductor material. Various different FINFET gate configurations are well known in the art, including but not limited to, different gate first polysilicon gate configurations, different gate first metal gate configurations, and different replacement metal gate configurations. Any such FINFET gate configuration could be incorporated into the FINFET 310 and, thus, the details thereof have been omitted from the specification in order to allow the reader to focus on the salient aspects of the disclosed embodiments related to the FINFET 310 being formed using a semiconductor fin 110 with divots 115. FINFET 310 can further include gate sidewall spacers 361 laterally surrounding gate 360. Gate sidewall spacers 361 can include one or more layers of dielectric sidewall spacer material (e.g., silicon nitride (SiN), carbon-doped SiN, silicon boron carbon nitride (SiBCN) or any other suitable dielectric sidewall spacer material). Gate sidewall spacers 361 can electrically isolate gate 260 from the source/drain regions 313.

Multiple instances of a single-fin FINFET, such as the FINFET 310 of FIG. 3A, and/or multiple instances of a multi-fin FINFET (similarly incorporating the upper portions of semiconductor fins 110 with divots 115) could be incorporated into a circuit. Within the circuit, the FINFETs can all have the same type of conductivity (e.g., all NFETs or all PFETs) or can have a combination of different types of conductivities (e.g., some NFETs and some PFETs). For example, multiple instances of a single-fin FINFET, such as the FINFET 310 of FIG. 3A, and/or multiple instances of a multi-fin FINFET (similarly incorporating the upper portions of semiconductor fins 110 with divots 115) could be incorporated into a memory cell, such as a static random access memory (SRAM) cell.

Figure 4:
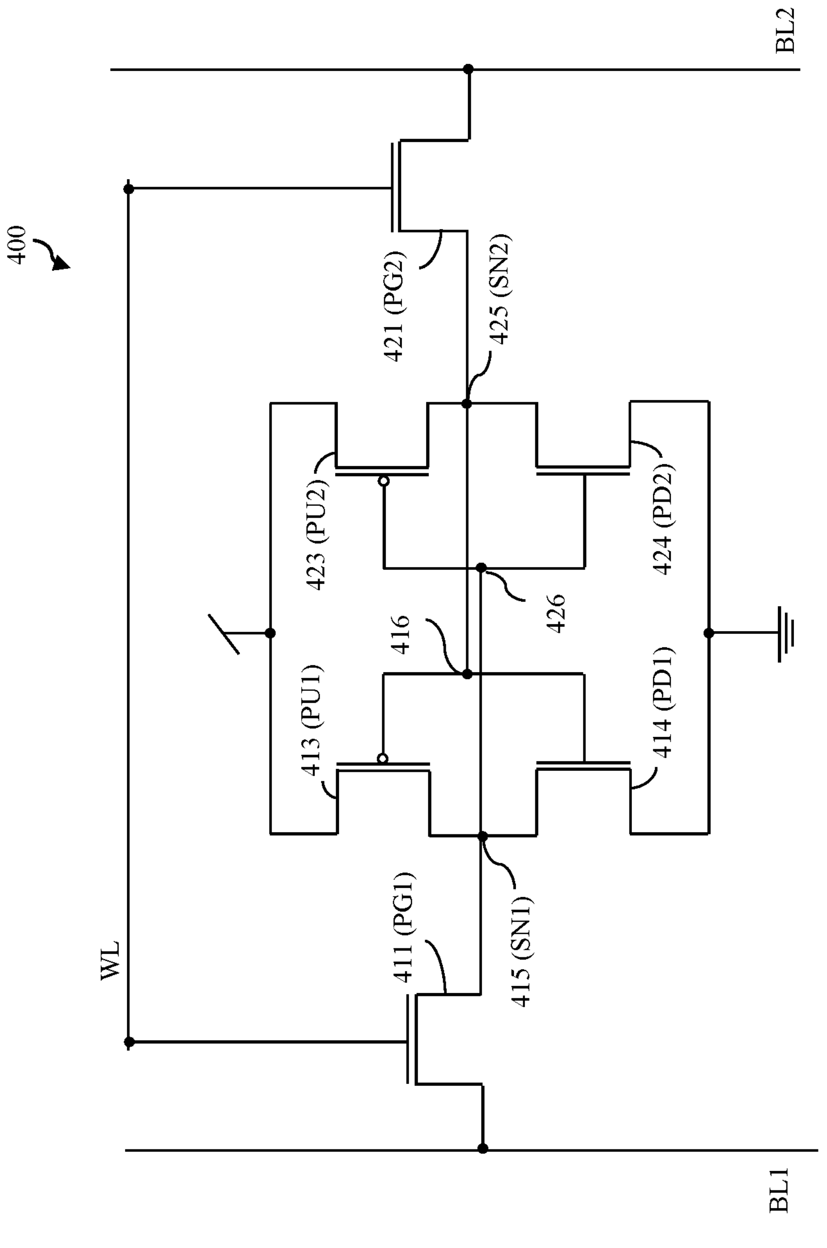
FIGS. 4 and 5 are a schematic diagram and a layout diagram illustrating a disclosed embodiment of a semiconductor structure that includes a circuit or portion thereof (e.g., a memory cell) that includes devices (e.g., FINFETs) with semiconductor fins having sidewall divots.

FIG. 4 is a schematic diagram illustrating an example of a 6-transistor (6T) SRAM cell 400. The SRAM cell includes first and second pass-gate transistors 411 and 421 (PG1 and PG2) (e.g., NFETs) and a pair of cross-coupled inverters (i.e., first and second inverter). The first inverter can include a first pull-up transistor 413 (PU1) (e.g., a PFET) and a first pull-down transistor 414 (PD1) (e.g., an NFET) connected in series between a positive supply voltage rail and ground. The second inverter can include a second pull-up transistor 423 (PU2) (e.g., a PFET) and a second pull-down transistor 424 (PD2) (e.g., an NFET) also connected in series between the positive supply voltage rail and ground. Gates of PU1 and PD1 of the first inverter can be electrically connected to the same shared first gate node 416 and gates of PU2 and PD2 of the second inverter can be electrically connected to the same shared second gate node 426. Additionally, as mentioned above, the first inverter and the second inverter can be cross-coupled. That is, the shared first gate node 416 of the first inverter can be electrically connected to a second storage node 425 (SN2) on the electrical connection between drains of PU2 and PD2 and the shared second gate node 426 of the second inverter can be electrically connected to a first storage node 415 (SN1) on the electrical connection between drains of PU1 and PD1. Furthermore, the source of PG1 can be connected to one bitline (BL1, also referred to as a true bitline (BLT)) of a complementary pair of bitlines and the source of PG2 can be connected to the other bitline (BL2, also referred to as the complementary bitline (BLC)) of the complementary pair of bitlines. The gates of PG1 and PG2 can be connected to a wordline (WL).

Such a 6T SRAM cell 400 can operate in three different stages: standby, write and read. In the standby state, the cell is idle. In the write stage, a data value is written into the cell. Specifically, if a data value of "1" (i.e., a high data value) is to be written to SN1, a "1" is applied to BL1 and a "0" is applied to BL2. Then, WL is activated to turn on PG1 and PG2 and the data value "1" is stored at SN1. Contrarily, if a data value of "0" (i.e., a low data value) is to be written to SN1, a "0" is applied to the BL1 and a "1" is applied to the BL2. Then, WL is activated to turn on PG1 and PG2 and the data value "0" is stored at SN1. In the reading stage, the data value stored in the cell is read. Specifically, the BL1 and BL2 are both pre-charged high (i.e., to a "1") and the WL is activated to turn on PG1 and PG2. When a data value of "1" is stored on SN1, BL1 will remain charged at its pre-charge level of "1" and the BL2 will be discharged to "0" through the PD2 and PG2. When a data value of "0" is stored on SN1, BL1 will be discharged to "0" through PD1 and PG1 and the BL2 will remain charged at its pre-charge level of "1." A sense amplifier (not shown) can sense whether BL1 or BL2 is the higher voltage level and, thereby will sense the data value stored in the SRAM cell 400.

Figure 5:
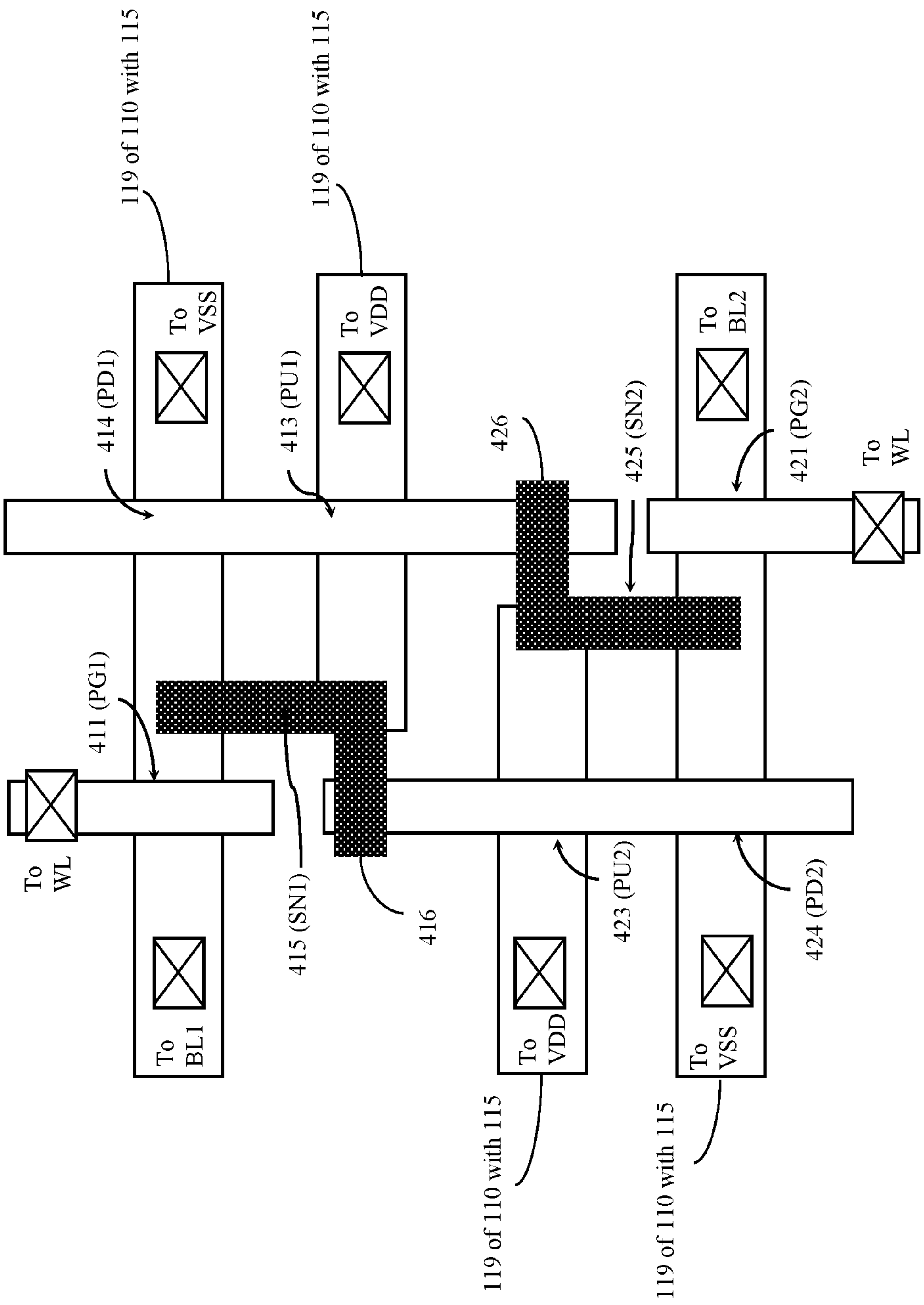

FIG. 5 is a layout diagram illustrating an example of a layout for the 6T SRAM cell 400 of FIG. 4 when such a 6T SRAM cell includes single-fin FINFETs. As illustrated in FIG. 5, the 6T SRAM cell 400 can be implemented using the upper portions 119 of four parallel semiconductor fins 110 with divots 115.

The above description of a 6T SRAM cell and its operation and layout are offered for illustration purposes only and is not intended to be limiting. It should be understood that a 6T SRAM cell with an alternative layout, another type of SRAM cell (e.g., a five transistor (5T) SRAM cell, an eight transistor (8T) SRAM cell) or another type of memory cell could alternatively incorporate FINFETs formed using the upper portions of semiconductor fins 110 with divots 115.

Figure 6:
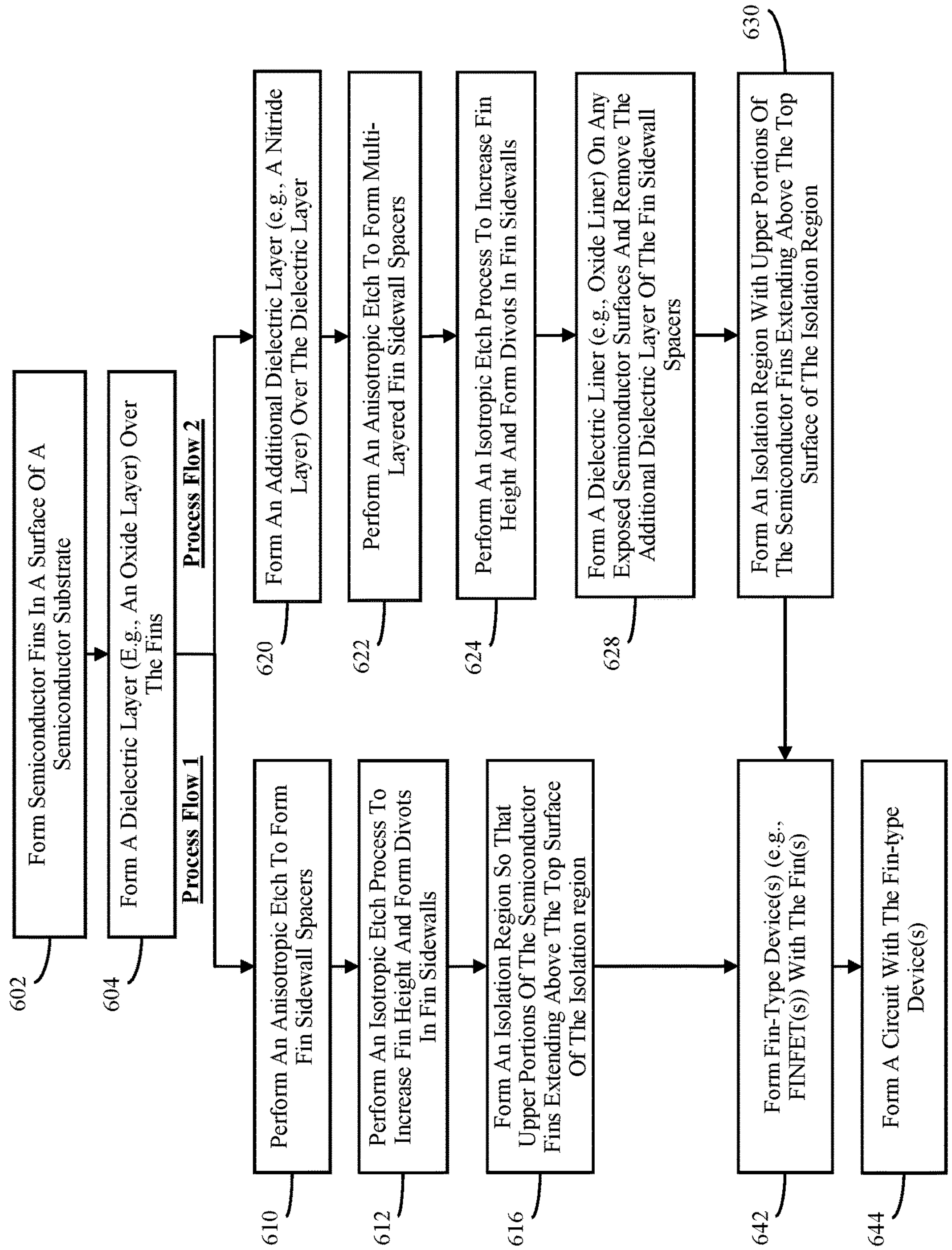
FIG. 6 is a flow diagram illustrating method embodiments for forming the disclosed semiconductor structures.

Referring to the flow diagram of FIG. 6, also disclosed herein are embodiments of a method for forming the above-described structures.

Figure 7:
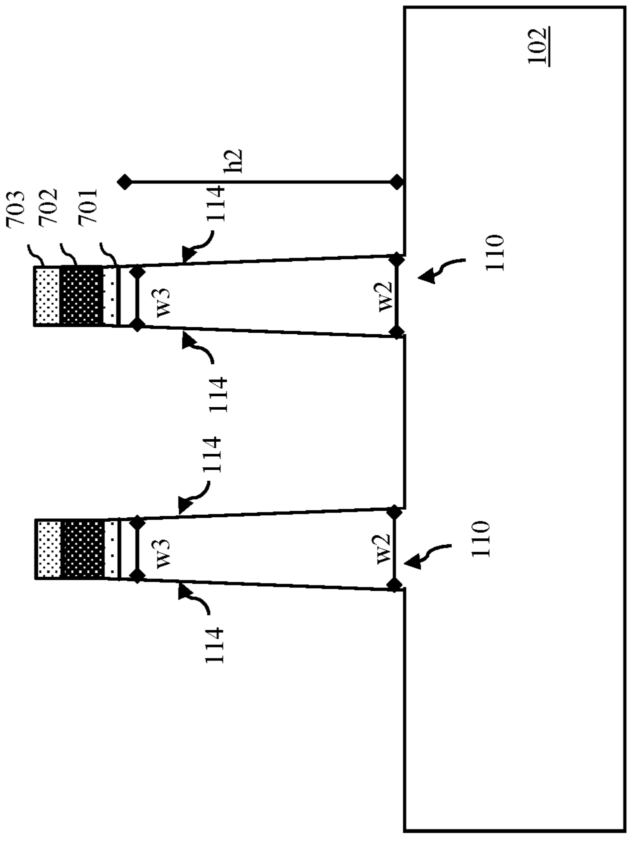
FIGS. 7 and 8 are cross-section diagrams illustrating partially completed semiconductor structures formed according to the flow diagram of FIG. 6.

The method can include providing a semiconductor substrate 102. The semiconductor substrate 102 can be, for example, a monocrystalline silicon substrate or a monocrystalline substrate of any other suitable semiconductor material (e.g., silicon germanium, silicon carbide, etc.). The method can further include forming semiconductor fins 110, which extend vertically from a surface of the semiconductor substrate 102 (see process 602 and FIG. 7). Such semiconductor fins 110 can initially be formed using known semiconductor fin formation techniques (e.g., lithographic patterning and etch techniques, sidewall image transfer (SIT) techniques, etc.). However, in the disclosed embodiments, the semiconductor fins 110 are only etched at process 602 to a height (h2) that is less than the full desired height (h1) of the semiconductor fins 110. For example, h2 can be 60-80% of h1 (e.g., h2 can be approximately 70% of h1). As illustrated, such processing can result in the semiconductor fins having stacked mask layers thereon including, for example, an oxide mask layer 701, a nitride mask layer 702 and an additional oxide mask layer 703.

Figure 8:
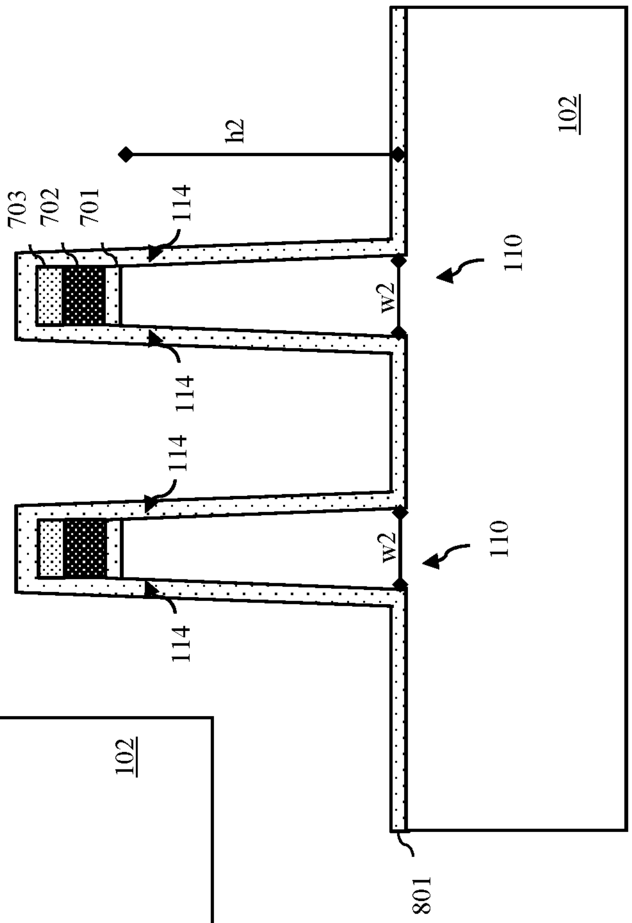

The method can include forming a dielectric layer 801 over the partially completed structure (see process 604 and FIG. 8). The dielectric layer 801 can include dielectric spacer material. The dielectric spacer material can be, for example, an oxide material, such as silicon dioxide, which has been conformally deposited by high density plasma (HDP) chemical vapor deposition (CVD) or any other suitable deposition process. Alternatively, the dielectric spacer material can be any other suitable dielectric spacer material (e.g., a different oxide material) that can be conformally deposited (e.g., a middle temperature oxide (MTO), etc.). It should be noted that the dielectric spacer material of this dielectric layer 801 is specifically not a nitride material.

Process Flow 1 and FIGS. 9-13 illustrate subsequent processing to form the semiconductor structure 100.2 of FIG. 1.2 and Process Flow 2 and FIGS. 14-21 illustrate subsequent processing to form the semiconductor structure 100.3 of FIG. 1.3.

Figure 9:
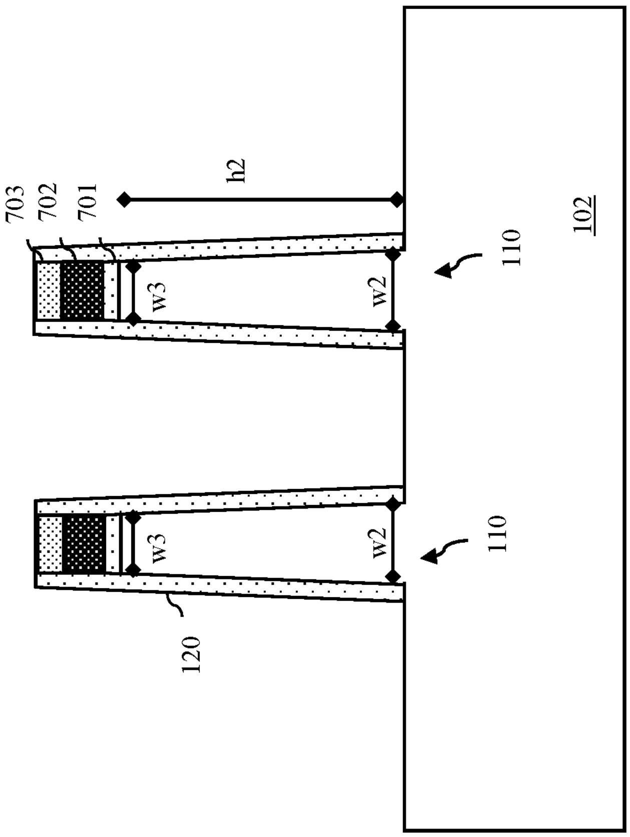
FIGS. 9-13 are cross-section diagrams illustrating partially completed semiconductor structures formed according to Process Flow 1 of FIG. 6.

Referring to Process Flow 1, the dielectric layer 801 can be selectively and anisotropically etched to form fin sidewall spacers 120 (see process 610 and FIG. 9). Specifically, process 610 can be performed to remove horizontal portions of the dielectric layer 801 (which as mentioned above has been conformally deposited) stopping once horizontal surfaces of the semiconductor substrate 102 are exposed. The remaining vertical portions of the dielectric layer 801 on the opposing sidewalls 114 (and opposing end walls, not shown) of the semiconductor fins 110 form the dielectric sidewall spacers 120.

Figure 10:
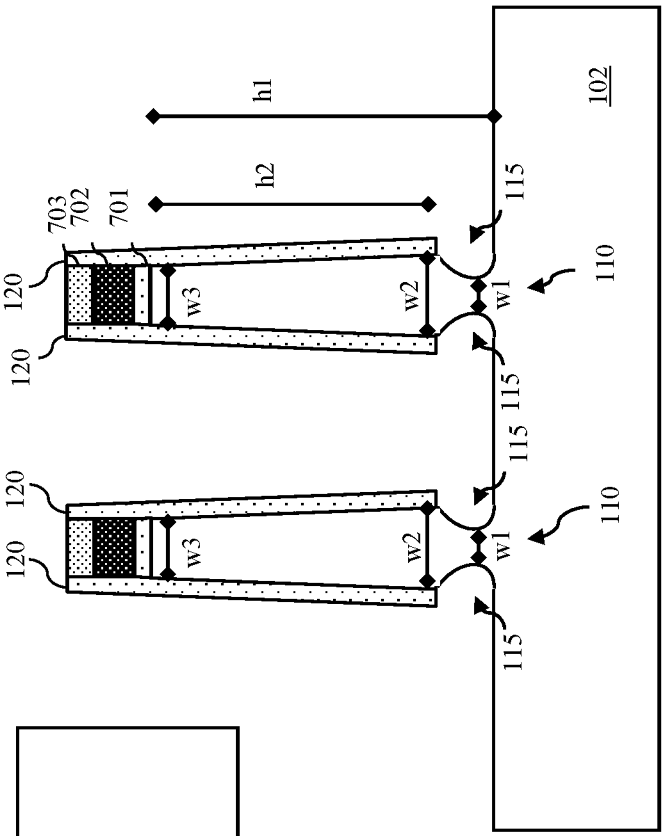
Figure 11:
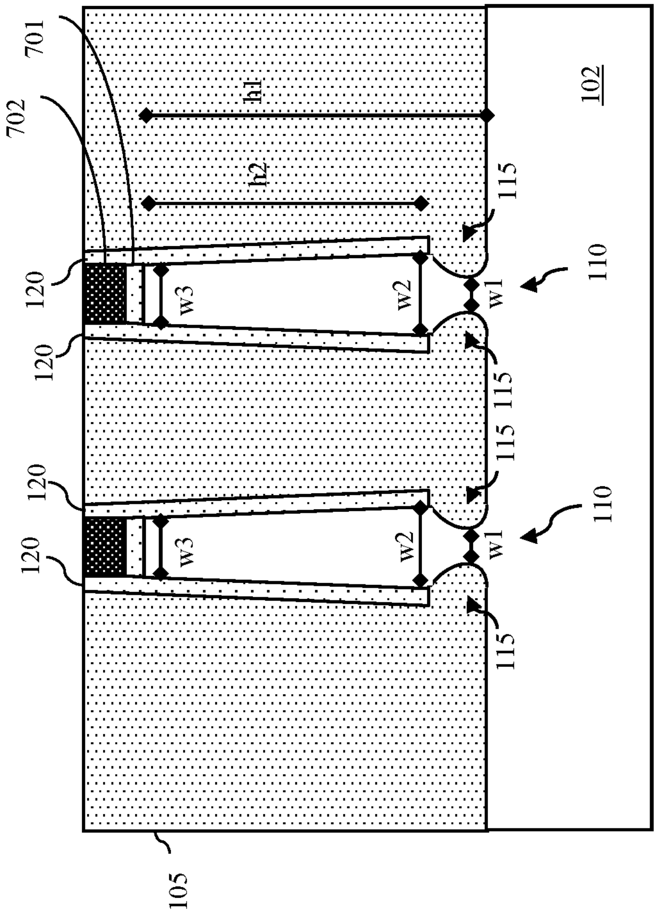
Figure 12:
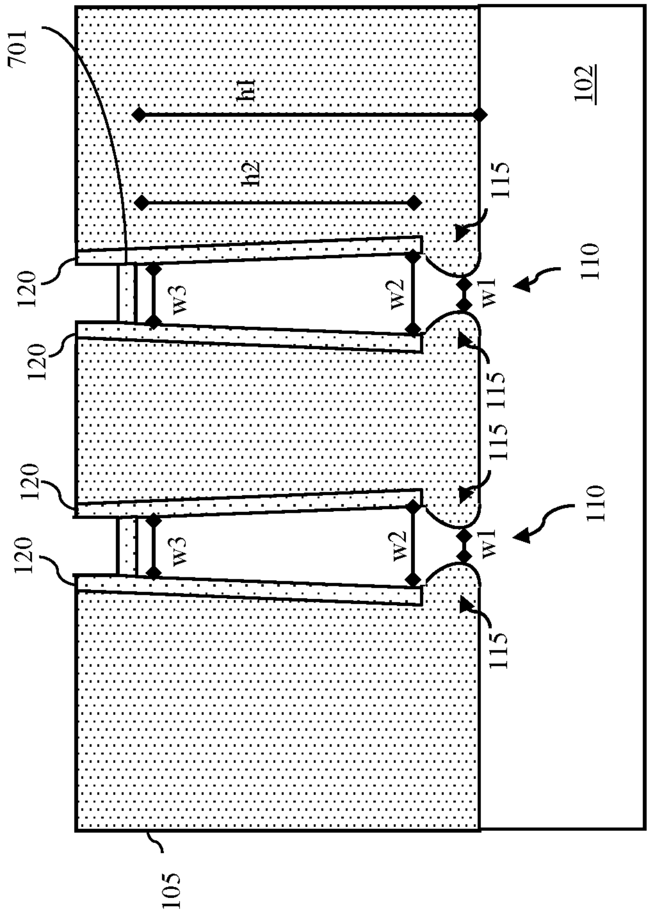
Figure 13:
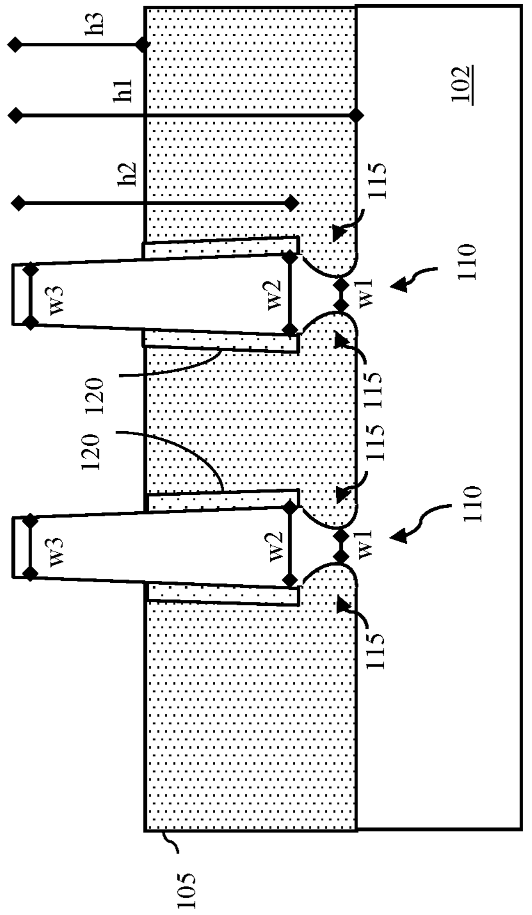

Subsequently, the exposed surfaces of semiconductor substrate 102 can be selectively and isotropically etched (see process 612 and FIG. 10). For example, if the semiconductor substrate 102 is a silicon substrate, an isotropic silicon wet etch process can be performed (e.g., using a potassium hydroxide (KOH) etchant or a tetramethylammonium hydroxide (TMAH) etchant). Alternatively, any other suitable isotropic silicon etch process could be used. Process 612 can specifically be performed to both: etch back the surface of the semiconductor substrate 102, thereby increasing the overall fin height to h1; and undercut the semiconductor fins 110 at the base 111 such that the lower portions 117 of the semiconductor fins 110 at the base 111 (i.e., proximal to the semiconductor substrate 102) have divots 115 within the opposing sidewalls 114 and opposing end walls (not shown). Those skilled in the art will recognize that, depending upon the etch technique used at process 612, the shape of the divots may vary (e.g., see FIGS. 2A-2E and detailed discussion above). However, on the opposing sidewalls 114, the divots 115 will be essentially symmetrical. Optionally, following process 612, a semiconductor layer can be grown over the partially completed structure (not shown) and employed to cure any damage to the semiconductor surface that occurred during previous process. The semiconductor layer can be, for example, polycrystalline or amorphous silicon.

Isolation region 150 can then be formed (see process 616). For example, at least one isolation layer 105 can be deposited over the partially completed structure (e.g., by CVD or other suitable technique) (see FIG. 11). The isolation material of the isolation layer(s) 105 can be, for example, any one or more of the following: silicon dioxide, silicon oxynitride, undoped silicate glass (USG), or any other suitable isolation material (e.g., borophosphosilicate glass (BPSG), phosphosilicate glass (PSG), etc.). In some embodiments, the isolation material can completely fill the divots 115. In other embodiments, the isolation material may instead encapsulate a gap (also referred to herein as a cavity) within each divot 115 (not shown). The resulting encapsulated gap can be filled with air, filled with gas, or under vacuum. A polishing process (e.g., a chemical mechanical polishing (CMP) process) can then be performed to recess the top surface of the isolation material, remove the additional oxide mask layer 703 from each semiconductor fin 110, and expose the nitride mask layer 702. Nitride mask layer 702 can then be selectively removed (e.g., a dry and wet deglaze process using a hydrofluoric acid treatment or other suitable process) (see FIG. 12). Next, an anisotropic etch process can be performed to remove oxide mask layer 70, recess the tops of the sidewall spacers 120, and further recess the top surface of the isolation layer(s) 105. This anisotropic etch process can be timed so as to expose the top 112 and opposing sidewalls 114 of the upper portions 119 of the semiconductor fins 110 (see FIG. 13). As illustrated, the etch process can be performed so that the upper portions 119 of the semiconductor fins 110 that extend above the top surface of the isolation layer(s) 105 have a predetermined height (see height (h3)).

Figure 14:
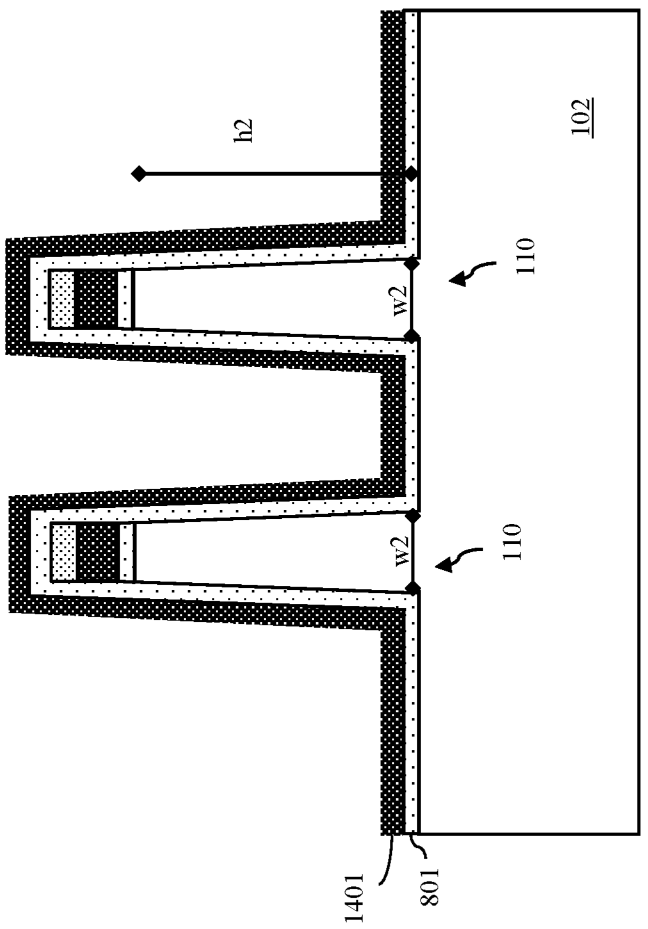
FIGS. 14-21 are cross-section diagrams illustrating partially completed semiconductor structure formed according to Process Flow 2 of FIG. 6.

Referring to Process Flow 2, before sidewall spacer 120 formation, an additional dielectric layer 1401 can be formed over the dielectric layer 801 (see process 620 and FIG. 14). The additional dielectric layer 1401 can be a conformal layer of a different dielectric spacer material than the dielectric layer 801. For example, the additional dielectric layer 1401 can be a conformal layer of a nitride material (e.g., silicon nitride) deposited, for example, by high density plasma (HDP) chemical vapor deposition (CVD) or any other suitable deposition process. It should be noted that, since two dielectric layers 801 and 1401 are employed in Process Flow 2, the dielectric layer 801 can be relatively thin.

Figure 15:
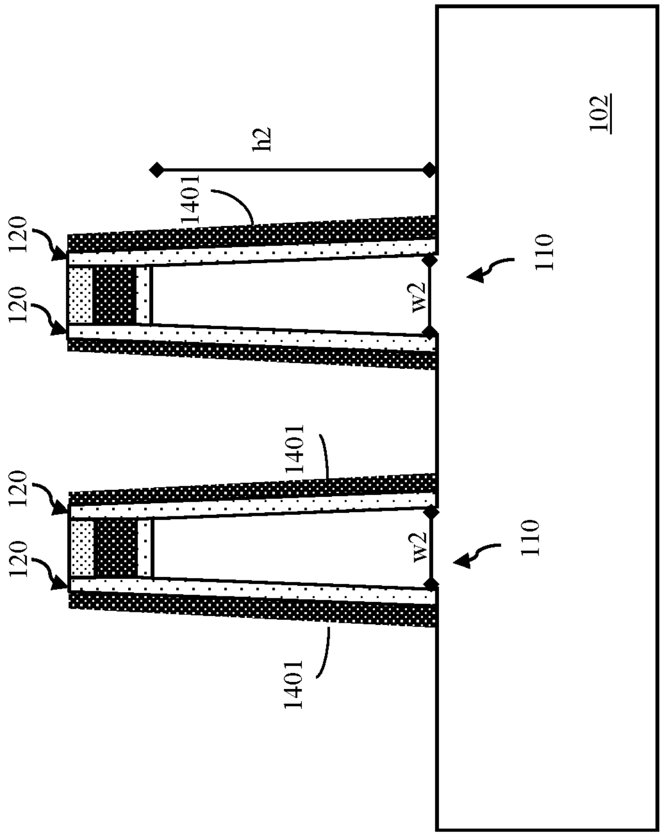

Next, the additional dielectric layer 1401 followed by the dielectric layer 801 can be selectively and anisotropically etched to form multi-layered fin sidewall spacers (see process 622 and FIG. 15). Specifically, process 622 can be performed to remove horizontal portions of the dielectric layers 1401 and 801, stopping once horizontal surfaces of the semiconductor substrate 102 are exposed. The remaining vertical portions of the dielectric layers 801 and 1401 on the opposing sidewalls 114 of the semiconductor fins 110 form sidewall spacers 120, which at this point in the processing are multi-layered.

Figure 16:
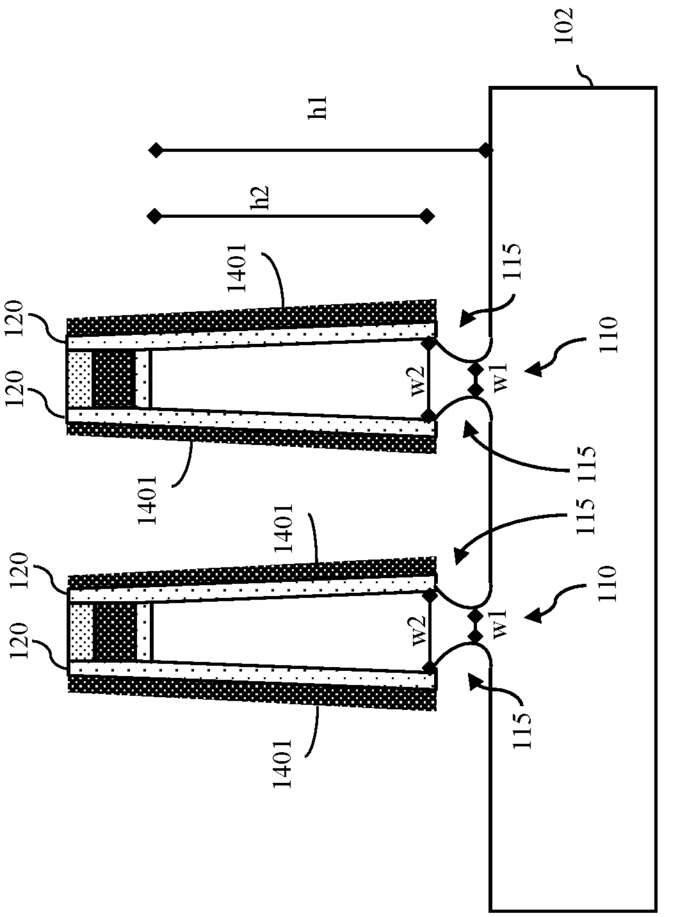

Subsequently, the exposed surfaces of semiconductor substrate 102 can be selectively and isotropically etched (see process 624 and FIG. 16). Process 624 can be performed in essentially the same manner as process 612 of Process Flow 1 discussed above.

Figure 17:
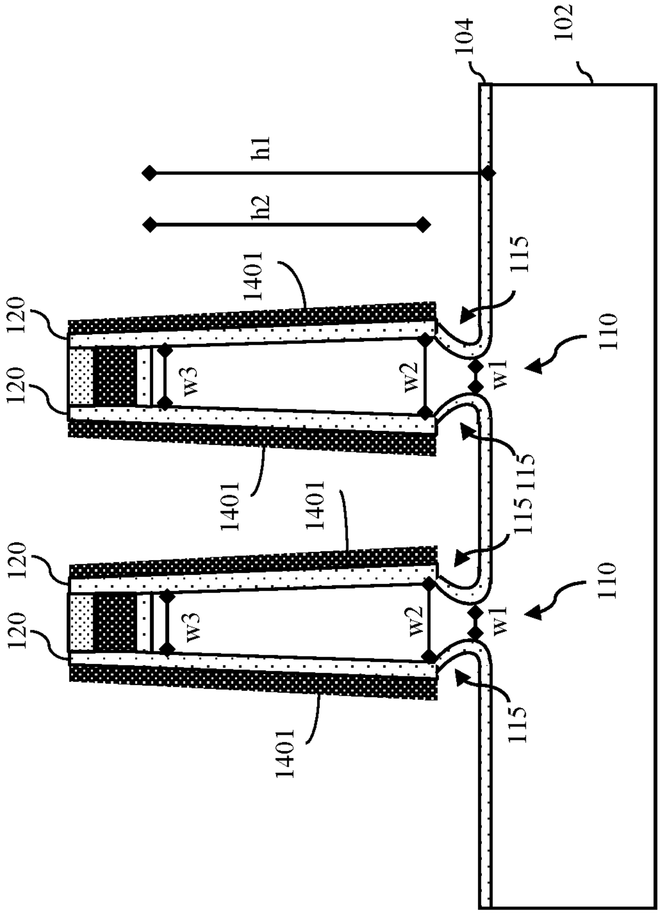
Figure 18:
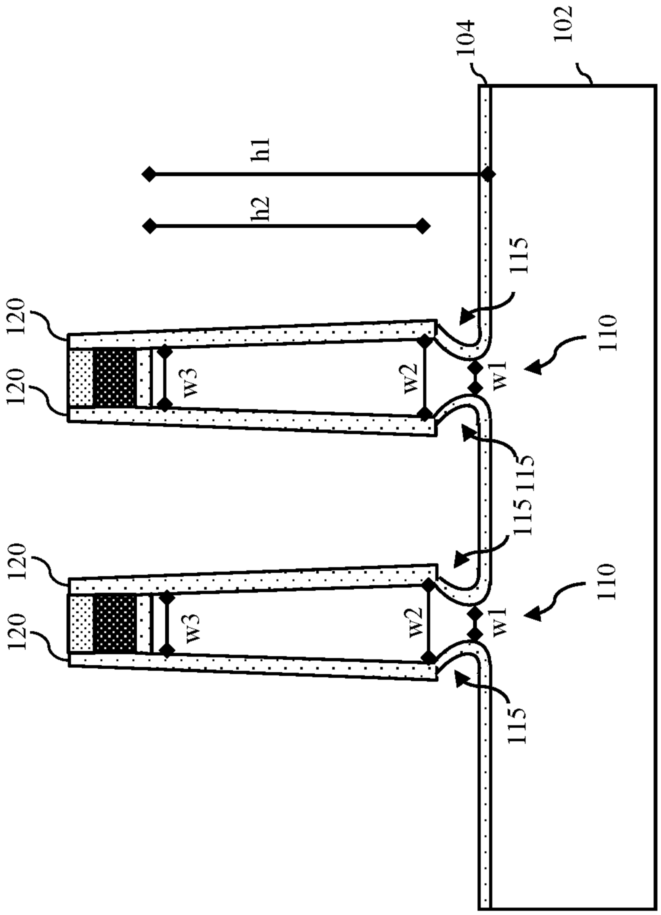

Next, a dielectric liner 104 can be formed on any exposed semiconductor surfaces, leaving the remaining material (e.g., nitride) of the additional conformal dielectric layer 1401 exposed (see process 628 and FIG. 17). The dielectric liner 104 can, for example, be an oxide liner formed, for example, using an in situ steam generation (ISSG) process for thermal oxidation process or other suitable technique. Next, the additional conformal dielectric layer 1401 of the sidewall spacers 120 can be selectively removed such that the remaining sidewall spacers 120 are single layered (see process 628 and FIG. 18). Removal of the nitride material of the additional conformal dielectric layer 1401 can, for example, be performed using a hot phosphoric acid ($H3PO4$) strip process or other suitable nitride strip process. Optionally, following process 628, a semiconductor layer can be grown over the partially completed structure (not shown) and employed to cure any damage to the semiconductor surface that occurred during previous process. The semiconductor layer can be, for example, polycrystalline or amorphous silicon.

Figure 19:
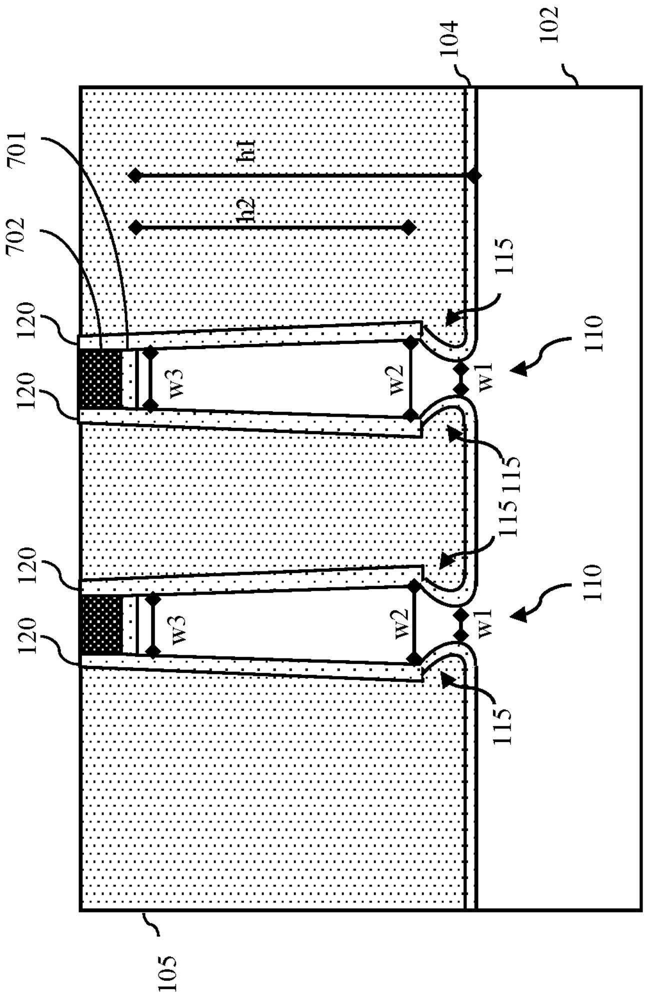
Figure 20:
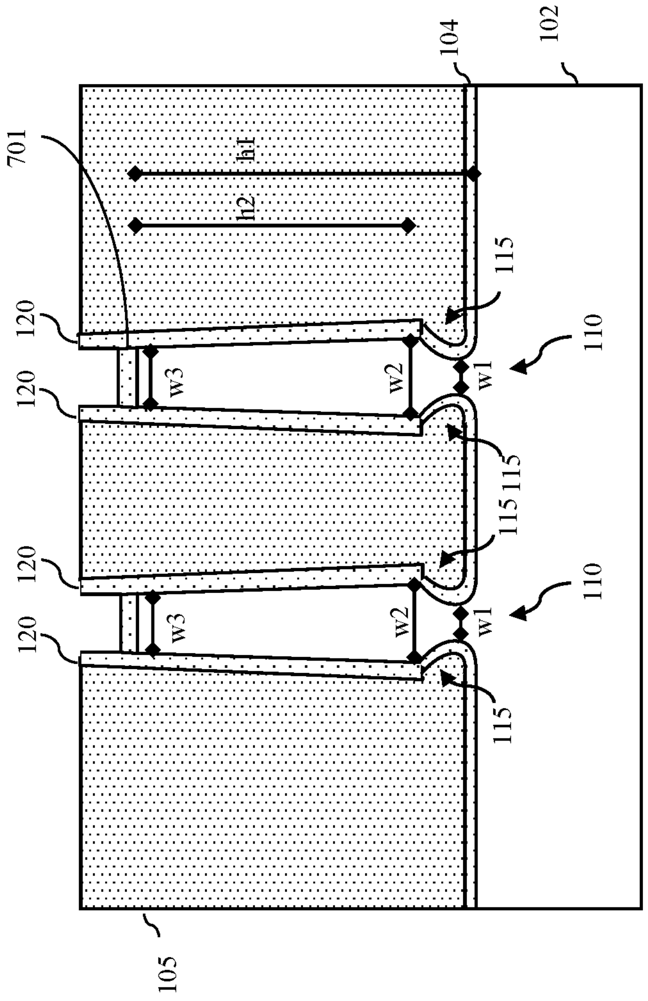
Figure 21:
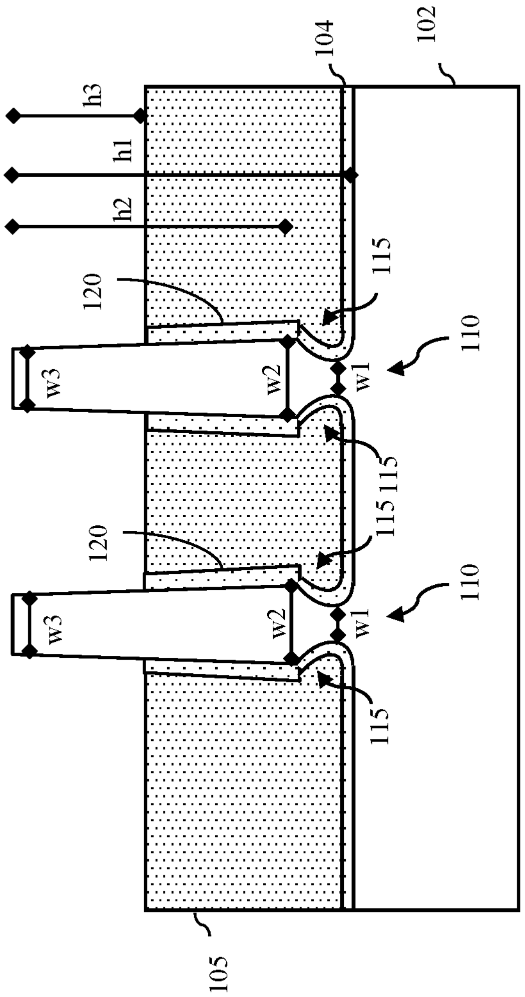

Isolation region 150 can then be formed (see process 630 and FIGS. 19-21). Process 630 can be performed in essentially the same manner as process 616 of Process Flow 1 discussed above.

As illustrated, both Process Flow 1 and Process Flow 2 result in the lower portion 117 of each semiconductor fin 110 having a base 111 with divots 115 on the opposing sidewalls 114 such that the base 111 is narrower (e.g., see first width (w1)) than the middle portion 118 (e.g., see second width (w2)>w1) and, optionally, such that the base 111 is narrower than both the middle portion 118 and the upper portion 119 (e.g., see third width (w3) at top 112, where w3>w1). For example, w1 can range between 10-60% of w2 (e.g., w1 can be approximately 20% of w2). Optionally, each semiconductor fin 110 can further have a tapering width from a point above the divots 115 to the top 112 (e.g., w3<w2).

Additionally, processing can include, but is not limited to, forming one or more single-fin or multi-fin fin-type devices using semiconductor fin(s) 110 with divots 115 and forming circuits using such fin-type device(s) (see processes 642-644). Techniques for forming fin-type devices and for forming circuits incorporating fin-type devices are well known in the art and, thus, the details thereof have been omitted form this specification in order to allow the reader to focus on the salient aspects of the disclosed embodiments related to formation of the semiconductor structures 100.1-100.3 of FIGS. 1.1-1.3. In some embodiments, the fin-type device(s) formed at process 642 can be FINFET(s) (e.g., see FINFET 310 of FIGS. 3A-3C, described in detail above). In some embodiments, the circuits formed at process 644 can include a memory cell, such as an SRAM cell (e.g., see 6T-SRAM cell 400 of FIGS. 4-5, described in detail above).

As mentioned above, in the disclosed embodiments, the semiconductor fin(s) 110 are narrowest at the base 111 (due to the divots 115) and, as a result, geometric isolation of the semiconductor substrate 102 from any devices formed above the isolation region 150 is improved. Thus, any fin-type device(s) (e.g., any FINFET(s) and, if applicable, memory cell(s) incorporating such FINFETs or any other fin-type device(s)) formed using the upper portions 119 of the semiconductor fins 110 are less susceptible to radiation-induced SEUs (i.e., are considered radiation-hardened) and will have reduced SERs. Consequently, the disclosed semiconductor structures are suitable for use in space and medical applications, where the likelihood of exposure to radiation may be increased and where the toleration for errors is limited.

It should be understood that in the structures and method described above, a semiconductor material refers to a material whose conducting properties can be altered by doping with an impurity. Such semiconductor materials include, for example, silicon-based semiconductor materials (e.g., silicon, silicon germanium, silicon germanium carbide, silicon carbide, etc.) and III-V compound semiconductors (i.e., compounds obtained by combining group III elements, such as aluminum (Al), gallium (Ga), or indium (In), with group V elements, such as nitrogen (N), phosphorous (P), arsenic (As) or antimony (Sb)) (e.g., GaN, InP, GaAs, or GaP). A pure semiconductor material and, more particularly, a semiconductor material that is not doped with an impurity for the purposes of increasing conductivity (i.e., an undoped semiconductor material) is referred to in the art as an intrinsic semiconductor. A semiconductor material that is doped with an impurity for the purposes of increasing conductivity (i.e., a doped semiconductor material) is referred to in the art as an extrinsic semiconductor and will be more conductive than an intrinsic semiconductor made of the same base material. That is, extrinsic silicon will be more conductive than intrinsic silicon; extrinsic silicon germanium will be more conductive than intrinsic silicon germanium; and so on. Furthermore, it should be understood that different impurities (i.e., different dopants) can be used to achieve different conductivity types (e.g., P-type conductivity and N-type conductivity) and that the dopants may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped with a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity and with silicon (Si) or oxygen to achieve N-type conductivity. Those skilled in the art will also recognize that different conductivity levels will depend upon the relative concentration levels of the dopant(s) in a given semiconductor region. Furthermore, when a semiconductor region or layer is described as being at a higher conductivity level than another semiconductor region or layer, it is more conductive (less resistive) than the other semiconductor region or layer; whereas, when a semiconductor region or layer is described as being at a lower conductivity level than another semiconductor region or layer, it is less conductive (more resistive) than that other semiconductor region or layer.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should be understood that the terminology used herein is for the purpose of describing the disclosed structures and methods and is not intended to be limiting. For example, as used herein, the singular forms "a," "an" and "the" are intended to include the plural forms as well, unless the context clearly indicates otherwise. Additionally, as used herein, the terms "comprises," "comprising," "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right," "left," "vertical," "horizontal," "top," "bottom," "upper," "lower," "under," "below," "underlying," "over," "overlying," "parallel," "perpendicular," etc., are intended to describe relative locations as they are oriented and illustrated in the drawings (unless otherwise indicated) and terms such as "touching," "in direct contact," "abutting," "directly adjacent to," "immediately adjacent to," etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various disclosed embodiments have been presented for purposes of illustration but are not intended to be exhaustive or limiting. Many modifications and variations will be apparent to those of ordinary skill in the art without departing from the scope and spirit of the disclosed embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:

a semiconductor fin extending from a semiconductor substrate and having opposing sidewalls and opposing end walls, wherein a lower portion of the semiconductor fin proximal to the semiconductor substrate has divots within the opposing sidewalls and within the opposing end walls; and an isolation region on the semiconductor substrate positioned laterally adjacent to the opposing sidewalls, wherein an upper portion of the semiconductor fin extends above the isolation region.

2. The structure of claim 1, wherein, due to the divots, the lower portion of the semiconductor fin has a base that is narrower than at least a middle portion of the semiconductor fin between the divots and the upper portion.

3. The structure of claim 1, wherein the isolation region includes at least one isolation layer.

4. The structure of claim 3, wherein the isolation region further includes sidewall spacers positioned laterally immediately adjacent to the opposing sidewalls of the semiconductor fin on a middle portion of the semiconductor fin between the divots and the upper portion.

5. The structure of claim 4, wherein the sidewall spacers and the at least one isolation layer include different isolation materials.

6. The structure of claim 3, wherein the isolation region further includes a dielectric liner on the lower portion of the semiconductor fin including within the divots and further on the semiconductor substrate adjacent to the lower portion, and wherein the dielectric liner and the at least one isolation layer include different isolation materials.

7. The structure of claim 1, wherein, above the divots, the opposing sidewalls and the opposing end walls are planar to a top of the semiconductor fin.

8. The structure of claim 1, further comprising a fin-type field effect transistor having an active device region including the upper portion of the semiconductor fin and a gate structure on the isolation region and positioned laterally adjacent to the opposing sidewalls.

9. A structure comprising:

a semiconductor substrate;

semiconductor fins extending from the semiconductor substrate, wherein the semiconductor fins have opposing sidewalls and wherein lower portions of the semiconductor fins proximal to the semiconductor substrate have divots within the opposing sidewalls, wherein, due to the divots, the lower portions of the semiconductor fins have bases that are narrower than at least middle portions of the semiconductor fins between the divots and the upper portions;

an isolation region on the semiconductor substrate positioned laterally adjacent to the opposing sidewalls of the semiconductor fins, wherein upper portions of the semiconductor fins extend above the isolation region; and a memory cell including multiple fin-type field effect transistors, wherein each fin-type field effect transistor includes an upper portion of at least one of the semiconductor fins.

10. The structure of claim 9, wherein the isolation region includes at least one isolation layer.

11. The structure of claim 10, wherein the isolation region further includes sidewall spacers positioned laterally immediately adjacent to the opposing sidewalls of the semiconductor fins on middle portions of the semiconductor fins between the divots and the upper portions, and wherein the sidewall spacers and the at least one isolation layer include different isolation materials.

12. The structure of claim 11, wherein the isolation region further includes a dielectric liner on the lower portions of the semiconductor fins including within the divots and further on the semiconductor substrate adjacent to the lower portions, and wherein the dielectric liner and the at least one isolation layer include different isolation materials.

13. The structure of claim 9, wherein the semiconductor fins have ends, and wherein the divots are within the opposing sidewalls and the ends.

14. A method comprising:

forming semiconductor fins extending from a semiconductor substrate, wherein the semiconductor fins have opposing sidewalls and opposing end walls, and wherein lower portions of the semiconductor fins proximal to the semiconductor substrate have divots within the opposing sidewalls and the opposing end walls; and forming an isolation region on the semiconductor substrate positioned laterally adjacent to the opposing sidewalls of the semiconductor fins, wherein upper portions of the semiconductor fins extend above the isolation region.

15. The method of claim 14, wherein the forming of the semiconductor fins includes:

initially forming the semiconductor fins;

forming a dielectric layer over the semiconductor fins;

forming sidewall spacers from the dielectric layer, wherein the forming of the sidewall spacers exposes horizontal surfaces of the semiconductor substrate;

etching the exposed horizontal surfaces of the semiconductor substrate, wherein the etching increases a height of the semiconductor fins and causes the divots, and wherein the forming of the isolation region includes:

depositing at least one isolation layer; and recessing the at least one isolation layer to expose the upper portions of the semiconductor fins.

16. The method of claim 15, wherein the sidewall spacers and the at least one isolation layer include different isolation materials.

17. The method of claim 15, wherein the forming of the semiconductor fins includes:

initially forming the semiconductor fins;

forming a dielectric layer over the semiconductor fins;

forming an additional dielectric layer on the dielectric layer, wherein the additional dielectric layer is a silicon nitride layer;

forming sidewall spacers from the dielectric layer and the additional dielectric layer, wherein the forming of the sidewall spacer exposes horizontal surfaces of the semiconductor substrate;

etching the exposed horizontal surfaces of the semiconductor substrate, wherein the etching increases a height of the semiconductor fins and causes the divots; and wherein the forming of the isolation region includes:

forming a dielectric liner on any exposed semiconductor surfaces;

removing the additional dielectric layer of the sidewall spacers;

depositing at least one isolation layer; and recessing the at least one isolation layer to expose the upper portions of the semiconductor fins.

18. The method of claim 15, further comprising: forming fin-type field effect transistors, wherein each fin-type field effect transistor includes an upper portion of at least one of the semiconductor fins.

19. The method of claim 18, further comprising forming a memory cell including the fin-type field effect transistors.

* * * * *